US006992990B2

(12) United States Patent
Sakusabe

(10) Patent No.: US 6,992,990 B2
(45) Date of Patent: Jan. 31, 2006

(54) RADIO COMMUNICATION APPARATUS

(75) Inventor: Kenichi Sakusabe, Tokyo (JP)

(73) Assignee: Sony Corporation, Tokyo (JP)

( * ) Notice: Subject to any disclaimer, the term of this patent is extended or adjusted under 35 U.S.C. 154(b) by 943 days.

(21) Appl. No.: 09/904,281

(22) Filed: Jul. 12, 2001

(65) Prior Publication Data

US 2002/0021685 A1 Feb. 21, 2002

(30) Foreign Application Priority Data

| Jul. 17, 2000 | (JP) | ........................................ 2000-215788 |
| Jul. 17, 2000 | (JP) | ........................................ 2000-215789 |
| Jul. 17, 2000 | (JP) | ........................................ 2000-215790 |

(51) Int. Cl.
*H04B 3/36* (2006.01)

(52) U.S. Cl. ........................ 370/293; 270/282; 270/278
(58) Field of Classification Search ................. 370/278, 370/279, 281, 282, 293, 295, 465
See application file for complete search history.

(56) References Cited

U.S. PATENT DOCUMENTS

| 5,101,499 A | 3/1992 | Streck et al. |
| 5,410,326 A | 4/1995 | Goldstein |
| 5,410,343 A | 4/1995 | Coddington et al. |

(Continued)

FOREIGN PATENT DOCUMENTS

| CN | 1249644 | 4/2000 |
| DE | 196 28 540 | 1/1998 |
| DE | 200 00 450 | 3/2000 |
| EP | 0 477 754 | 4/1992 |

(Continued)

OTHER PUBLICATIONS

Vazquez–Cortizo D et al: "FS–aloha, a collision resolution algorithm with Qos support for the contention channel in multiservices wireless Lan" Global Telecommunications Conference (GLOBECOM 99), vol. 5, Dec. 5, 1999, pp. 2773–2777, XP010373453.
"Wireless Medium Access Control (MAC) and Physical (PHY) Specifications" IEEE Standard 802.11–1997, XX, XX, 1997, pp. 71–99, XP002927753.
Gang Wu et al: "WINMAC: a novel transmission protocol for infostations" Vehicular Technology Conference, 1999 IEEE 49th Houston, TX, USA May 16–20, 1999, Piscataway, NJ, USA, IEEE, US, May 16, 1999, pp. 1340–1344, XP010342188, ISBN: 0–7803–5565–2.
Truman T et al: "The Infopad Multimedia Terminal: A Portable Device for Wireless Information Access" IEEE Transactions on Computers, IEEE Inc. New York, US, vol. 47, No. 10, Oct. 1, 1998, pp. 1073–1087, XP000781992.
Patent Abstracts of Japan vol. 1998, No. 14, Dec. 31, 1998 & JP 10 257401 A (Access:KK) Sep. 25, 1998.

*Primary Examiner*—Duc Ho
*Assistant Examiner*—Thien D Tran
(74) *Attorney, Agent, or Firm*—Frommer Lawrence & Haug LLP; William S. Frommer; Darren M. Simon

(57) ABSTRACT

Radio communication apparatus includes a baseband processor for modulating data to be transmitted into an IF signal and for demodulating an IF signal derived from a received high frequency signal. A front end section receives the IF signal from the baseband processor and converts that IF signal into a high frequency signal for transmission. The front end section also is adapted to receive a high frequency signal from a remote location, and converts the received high frequency signal into an IF signal that is supplied to the baseband processor for demodulation and data recovery. The front end section is operable in a plurality of frequency bands and is tunable to a frequency within a selected one of the frequency bands for use as a radio frequency channel. Consequently, the number of simultaneously assigned channels in the same area can be markedly increased and the possibility of interrupting a communication link is significantly reduced.

19 Claims, 20 Drawing Sheets

U.S. PATENT DOCUMENTS

| | | |
|---|---|---|
| 5,467,341 A | 11/1995 | Matsukane et al. |
| 5,802,467 A | 9/1998 | Salazar et al. |
| 5,862,339 A | 1/1999 | Bonnaure et al. |
| 5,896,131 A | 4/1999 | Alexander |
| 5,917,810 A | 6/1999 | De Bot |
| 5,920,701 A | 7/1999 | Miller et al. |
| 5,933,141 A | 8/1999 | Smith |
| 5,949,432 A | 9/1999 | Gough et al. |
| 6,012,088 A | 1/2000 | Li et al. |
| 6,028,600 A | 2/2000 | Rosin et al. |
| 6,037,998 A | 3/2000 | Usui et al. |
| 6,097,441 A | 8/2000 | Allport |
| 6,263,503 B1 | 7/2001 | Margulis |
| 6,396,523 B1 | 5/2002 | Segal et al. |
| 6,417,869 B1 | 7/2002 | Do |
| 6,469,633 B1 | 10/2002 | Wachter |
| 6,563,858 B1 * | 5/2003 | Fakatselis et al. .......... 375/148 |
| 6,670,970 B1 | 12/2003 | Bonura et al. |
| 6,714,765 B1 * | 3/2004 | Kimppa ....................... 455/76 |
| 6,728,517 B2 * | 4/2004 | Sugar et al. .................. 455/73 |
| 6,731,101 B2 * | 5/2004 | Miyagawa et al. ...... 324/76.79 |
| 6,748,199 B2 * | 6/2004 | Nakano ................... 455/192.2 |
| 6,845,090 B1 * | 1/2005 | Takabatake et al. ........ 370/338 |

FOREIGN PATENT DOCUMENTS

| | | |
|---|---|---|
| EP | 0 537 814 | 4/1993 |
| EP | 0 617 556 | 9/1994 |
| EP | 0 793 170 | 9/1997 |
| EP | 0 838 945 | 4/1998 |
| EP | 0 848 560 | 6/1998 |
| EP | 0 942 572 | 9/1999 |
| EP | 0 967 797 | 12/1999 |
| EP | 1 001 627 | 5/2000 |
| EP | 1 011 257 | 6/2000 |
| GB | 2 343 334 | 5/2000 |
| WO | WO 95 34168 | 12/1995 |
| WO | WO 98 59282 | 12/1998 |
| WO | WO 99 34599 | 7/1999 |
| WO | WO 00 14919 | 3/2000 |
| WO | WO 01 35551 | 5/2001 |
| WO | WO 01 35585 | 5/2001 |

* cited by examiner 2.4 GHz BAND

5 GHz BAND

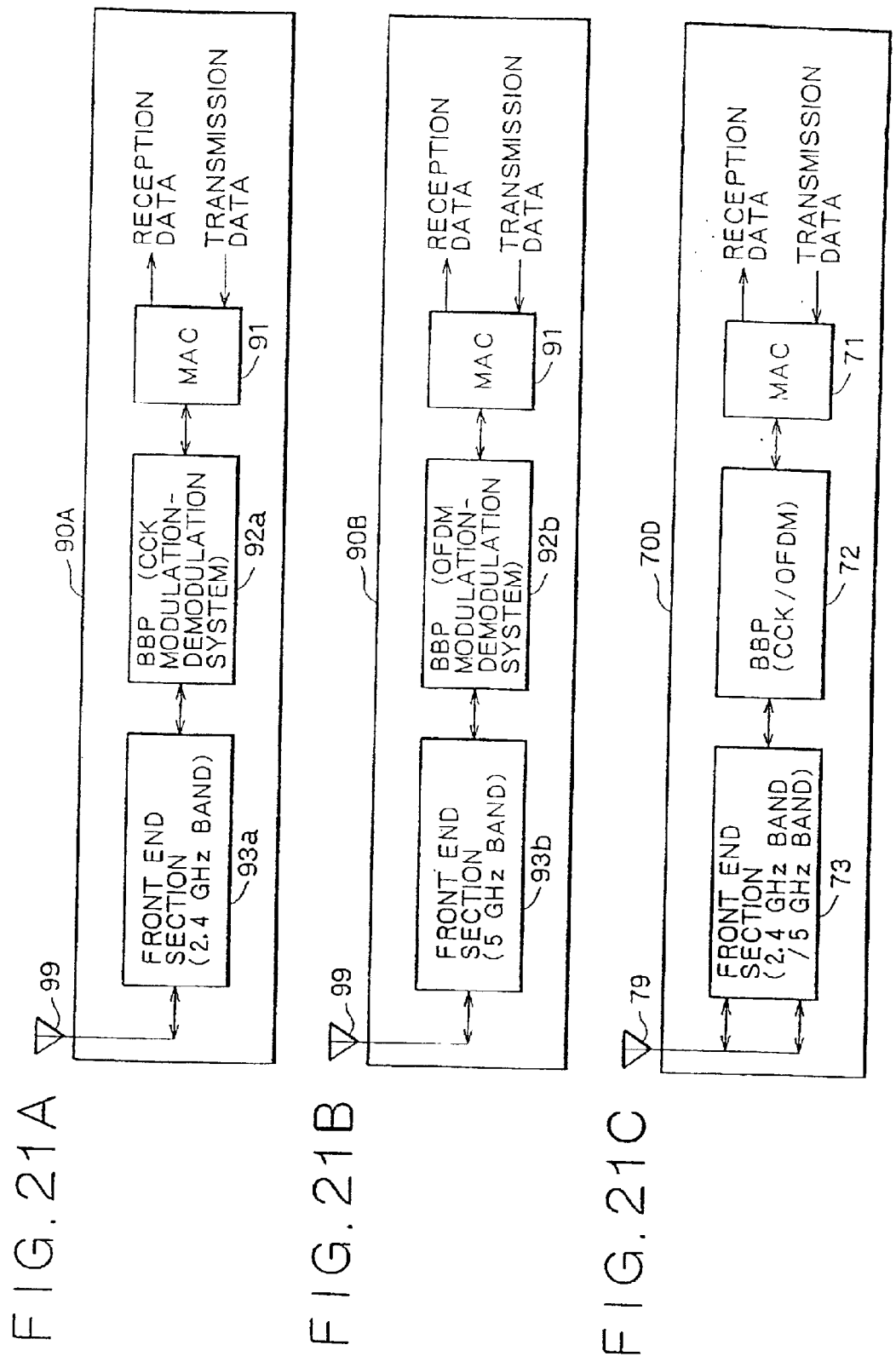

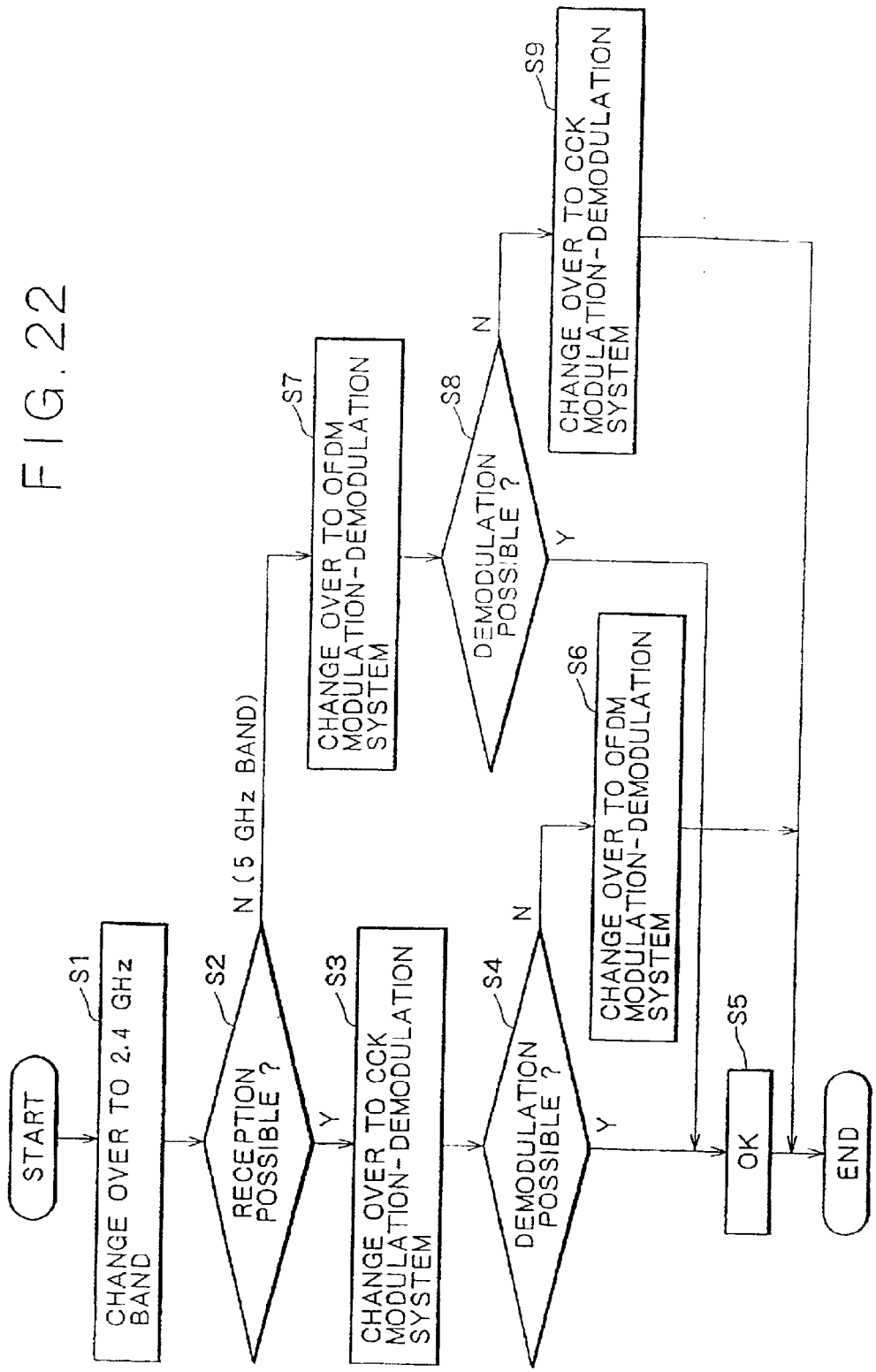

RADIO COMMUNICATION APPARATUS

BACKGROUND OF THE INVENTION

This invention relates to radio communication apparatus having particular utility in a radio LAN (Local Area Network) system and, more particularly, to radio communication apparatus that can operate in an environment exhibiting disturbances and interference.

A radio LAN system has been proposed to communicate between pieces of equipment in a limited area such as within a building, a residence, a house or within a room. To this end, the IEEE (The Institute of Electrical and Electronics Engineers, Inc.) 802.11 standards prescribe a 2.4 GHz band as a radio frequency band which can be used for such a radio LAN system.

SUMMARY OF THE INVENTION

FIG. 1 shows a radio LAN system of the 2.4 GHz band wherein data to be transmitted are converted into packets for data transfer by a media access controller (MAC) 91 which assembles packets for transmission and disassembles packets that are received. The data packets are modulated at a high transfer rate into an intermediate frequency (IF) signal on the order of several hundred MHz by a baseband processor (BBP) 92 which modulates the data packets for transmission and demodulates the IF signal when data is received. The intermediate frequency signal is converted into a high frequency signal of a radio frequency selected within the 2.4 GHz band by a front end section 93, and the high frequency signal is transmitted from an antenna 99.

Upon reception of data by the radio communication apparatus, the high frequency signal transmitted from another radio communication device is received by the antenna 99 and converted into an intermediate frequency signal by the front end section 93. This IF signal is demodulated by the baseband processor 92 to recover data in the form of packets, and these recovered data packets are disassembled by the media access controller 91.

The baseband processor 92 may use as a modulation-demodulation format the CCK (Complementary Code Keying) format, the OFDM (Orthogonal Frequency Division Multiplexing) format or the QPSK (Quadrature Phase Shift Keying) format.

In this radio LAN system, the data transferable distance between different pieces of equipment is approximately 100 m line-of-sight. Therefore, if a radio LAN system is constructed for each house or for each room in a building located in a district that is densely populated or in which rooms are located near each other, since radio waves propagate easily through walls that do not contain metal, several interfering radio LAN systems may be present simultaneously in one area.

The IEEE 802.11 standard prescribes 11 channels (from channel 1 to channel 11) allocated in the 2.4 GHz band from 2.400 to 2.483 GHz, with each channel being set to a respective frequency 5 MHz apart. To accommodate a plurality of channels simultaneously within the same area, the frequency interval between adjacent channels that can be used in that area should be equal to or greater than 25 MHz, schematically depicted in FIG. 2. In this way, since the high frequency signal has a modulated fixed bandwidth, if the frequencies of adjacent channels are closer to each other, such as separated by 5 MHz, the signal of one channel acts as a disturbing radio wave to the signal of another channel. Therefore, the number of channels in the 2.4 GHz band that should be assigned for simultaneous use within the same area should be limited to 3 at a maximum, as indicated by channels 1, 6 and 11 in FIG. 2. As a result, there may not be sufficient channels available for use if a radio LAN system is to be used for each building or for each house or for each room in a densely populated district.

The IEEE 802.11 standard permits a communication protocol that assures a communication link while sharing free time of the same channel; although the transfer rate may be lowered. However, a radio wave that does not comply with the IEEE 802.11 standard or radio interference that may disturb communication in the radio LAN system, such as radio wave leakage of a microwave oven or radio wave communication of a digital cordless telephone, may be present within the operating area of the radio LAN system and may be within the 2.4 GHz band. As a result, image data or sound data may not be satisfactorily transferred in real-time through a radio LAN system in the environment of such disturbing radio waves.

Recently, the IEEE 802.11 standard has proposed the 5 GHz band as a frequency band for a radio LAN system. Consequently, one may use the 5 GHz band in place of the 2.4 GHz band as the communication band for a radio LAN system. However, the same drawbacks and difficulties may arise with regard to the 5 GHz band as may arise in the 2.4 GHz band, so that the frequency interval between adjacent channels in the 5 GHz band should be equal to or greater than 20 MHz where plural channels are used within the same area, especially in densely populated areas. Therefore, the number of channels which can be used simultaneously within the same area in the 5 GHz band, without causing interference between channels, is limited to 4, as seen from FIG. 3. Here too, if external disturbances or interference are present, as from microwave leakage or digital cordless telephones, then if a radio LAN system is to be used for each building or for each house or for each room in a densely populated district, a sufficient number of channels may not be available.

The present invention provides radio communication apparatus that is well-adapted for a radio LAN system which increases the number of channels that can be assigned simultaneously within the same area and reduces the possibility that a communication link may be interrupted by interference or disturbances.

The radio communication apparatus of the present invention is well-adapted to be combined with existing popular radio communication equipment so as to form a single band radio LAN system.

The radio communication apparatus of this invention preferably includes a baseband processor for modulating data to be transmitted into an IF signal and for demodulating an IF signal derived from a received high frequency signal. A front end section receives the IF signal from the baseband processor and converts that IF signal into a high frequency signal for transmission. The front end section also is adapted to receive a high frequency signal from a remote location, and converts the received high frequency signal into an IF signal that is supplied to the baseband processor for demodulation and data recovery. The front end section is operable in a plurality of frequency bands and is tunable to a frequency within a selected one of the frequency bands for use as a radio frequency channel. Consequently, the number of simultaneously assigned channels in the same area can be markedly increased and the possibility of interrupting a communication link is significantly reduced.

The front end section may include plural front end circuits, each corresponding to one of the frequency bands. Alternatively the front end section may include one front end circuit that is common to the frequency bands.

As one aspect of the present invention, a frequency change-over selector selects one of the frequency bands and a frequency channel within the selected frequency band for communication with minimal disturbance.

According to another aspect of this invention, the baseband processing section may use any one of plural modulation-demodulation schemes, or formats, to modulate and demodulate the data. Thus, frequency bands, frequency channels and modulation formats may be selected and changed over to improve communication and increase reliability.

Preferably the frequency bands include the 2.4 GHz band and the 5 GHz band; and the modulation-demodulation formats include CCK and OFDM. Typically, when the control section selects the 2.4 GHz band, the CCK format is used; and when the 5 GHz band is selected, the OFDM format is used.

BRIEF DESCRIPTION OF THE DRAWINGS

The following description, given by way of example and not intended to limit the present invention solely thereto, will best be understood by referring to the accompanying drawings, in which:

FIGS. 21A–21C are block diagrams illustrating single band radio LAN systems using different frequency bands and different modulation formats; and FIG. 22 is a flow chart illustrating an example of a frequency band and modulation format changeover routine that can be used in the present invention.

DETAILED DESCRIPTION OF CERTAIN PREFERRED EMBODIMENTS

Figure 4:
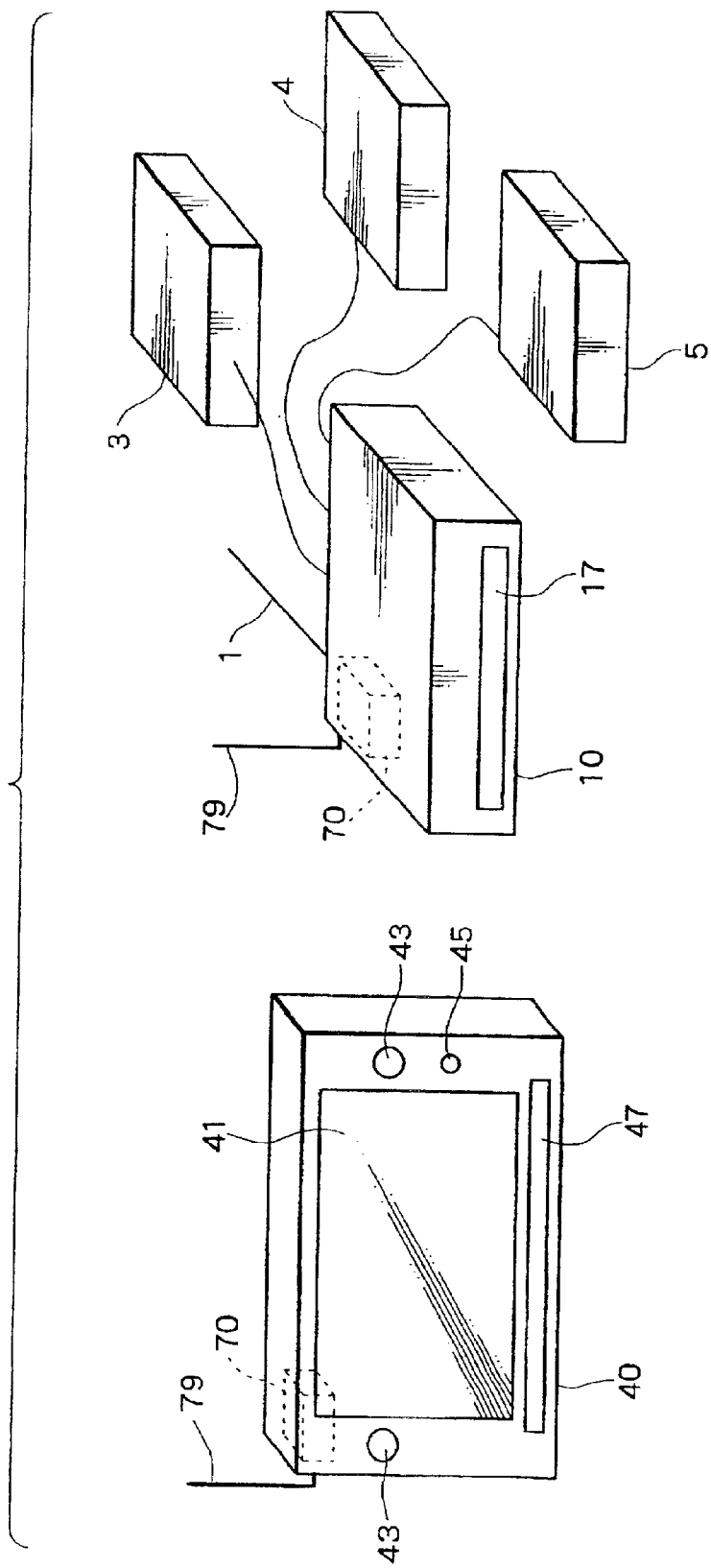
FIG. 4 is a block diagram of an example of a radio LAN system which incorporates the present invention.

Referring to FIG. 4, there is shown an example of a radio LAN system which incorporates radio communication equipment according to the present invention. The illustrated system includes a base terminal (or base unit) 10 and a portable terminal 40. Base terminal 10 is coupled by way of a telephone link 1 to external equipment to permit telephone communication therewith. Examples of such external equipment include the internet, a data base, a remote terminal, or the like, each of which is adapted to communicate with the base unit by way of the telephone link. Base unit 10 also is coupled to various external devices, such as a set top box (STB) 3, a digital versatile disk player (DVD) 4, a video tape recorder, such as a digital video tape recorder (D-VTR) 5, or the like. By way of these connections, which may be hard wired, infrared, or wireless connections, audio and/or video information may be communicated from these external devices to base unit 10 and, similarly, audio and/or video information as well as operation control data may be communicated from the base unit to these external devices.

Base unit 10 includes an operation control section 17, a radio communication section 70 and an antenna 79, all of which are described in further detail below in connection with, for example, FIG. 5. It will be appreciated that radio communication section 70 and antenna 79 permit the transmission of audio and/or video information supplied to the base unit 10 from external devices 3, 4, 5, etc. to portable terminal 40 and, likewise, permit the user of the portable terminal to effect suitable controls over the base terminal as well as the external devices by transmitting user-initiated control data to the base terminal via antenna 79 and radio communication section 70.

Portable terminal 40 includes a liquid crystal display (LCD) unit 41 which displays an image thereon, speakers 43 for generating audible information and a microphone 45 for converting audible sounds into corresponding electrical signals. Like base terminal 10, the portable terminal includes a radio communication section 70 and an antenna 79. Portable terminal 40 further includes an operation control section 47, similar to operation control section 17, and illustrated more particularly in FIG. 6.

Figure 5:
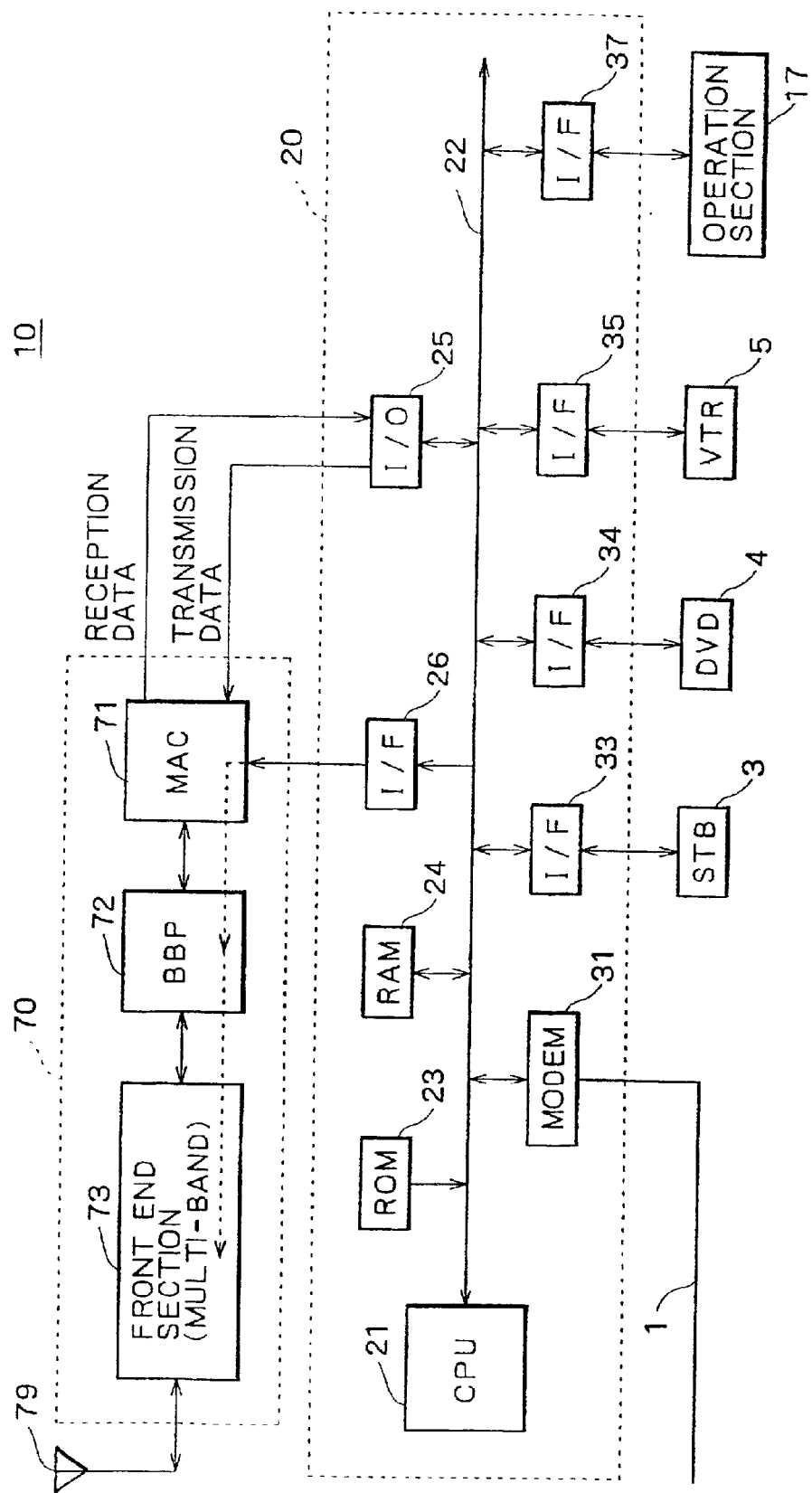
FIG. 5 is a block diagram showing an example of a base terminal.

Turning to FIG. 5, base terminal 10 is illustrated in greater detail and is seen to include radio communication section 70 and a control unit 20. The control unit is comprised of a bus 22 over which information is communicated under the control of a central processing unit (CPU) 21. A ROM 23 is coupled to bus 22 and stores therein the software program executed by CPU 21. A RAM 24 also is coupled to the bus and functions, inter alia, as a temporary storage device to provide the usual working area for the operation of the CPU.

A modem 31 is coupled to bus 22 and provides the usual interface between control unit 20 and telephone link 1. In addition, and as schematically represented, set top box 3, digital versatile disk player 4, video recorder 5, as well as other external devices (not shown) are coupled to bus 22 by way of interface (I/F) circuits 33, 34 and 35, respectively. These I/F circuits provide the interfaces for audio and/or video information to be supplied to base terminal 10 for communication to portable terminal 40 by way of radio communication section 70 (as will be described) and also permit control data to be communicated from the base terminal to the external devices for controlling the individual operations thereof, such as channel selection, playback, stop, etc. Operation section 17 also is coupled to bus 22 by way of an interface circuit 37.

Radio communication section 70 is adapted to transmit to portable terminal 40, by way of suitable radio frequencies, to be described, audio and/or video information (hereinafter referred to as A/V information) as well as control data. Likewise, the radio communication section operates to receive, from the portable terminal, by way of high frequency radio transmission, control data and other information used to control the external devices coupled to the base terminal and to permit interaction with an external network, such as the internet, by way of telephone link 1. The radio communication section 70 includes a media access controller (MAC) 71, a baseband processor (BBP) 72 and a multi-band front end section 73. The media access controller is adapted to assemble data packets from information supplied thereto by input/output I/O port 25 which, in turn, is coupled to bus 22. Media access controller 71 also is adapted to disassemble data packets that are received from, for example, portable terminal 40; and to supply the disassembled data to I/O port 25 from whence the data is coupled to a suitable external device or external network.

Baseband processor 72 operates to modulate the data packets supplied thereto from media access controller 71 in accordance with a selected modulation format, such as the aforementioned CCK, OFDM or QPSK formats. The modulated data packets are modulated onto an intermediate frequency (IF) on the order of several hundred MHz. This IF signal is supplied from baseband processor 72 to front end section 73 for up-conversion and, if desirable, further modulation, to a higher frequency for transmission via antenna 79.

Similarly, high frequency signals transmitted from portable terminal 40 are received by antenna 79 and down-converted by the front end section to derive an IF signal comprised of the modulated data packets. The IF frequency of this derived IF signal may be the same as the IF frequency of the IF signal that is up-converted and transmitted to the portable terminal. The derived, or recovered, IF signal is demodulated by baseband processor 72 to recover the data packets that are supplied to and disassembled by media access controller 71.

Thus, it will be appreciated that data, such as A/V information, command data, or the like, are assembled into data packets, modulated to an IF frequency, up-converted to a high radio frequency and transmitted from front end section 73 to portable terminal 40. Also, data, including information and command data, returned from the portable terminal to base terminal 10 are received at high radio frequencies by antenna 79, down-converted by front end section 73 to an IF signal, demodulated by baseband processor 72, packet-disassembled by media access controller 71 and supplied, by way of I/O port 25 to an external device or the external network coupled to base terminal 10.

Figure 1:
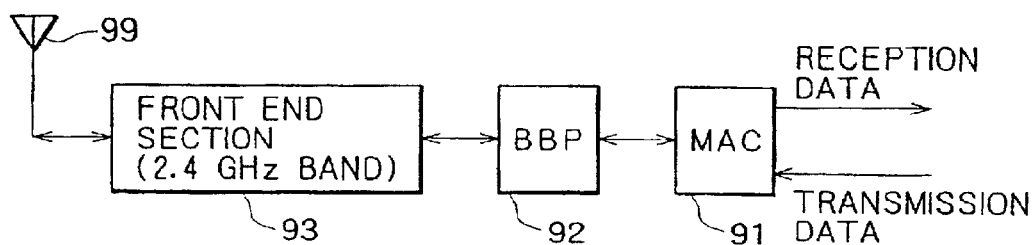
FIG. 1 is a block diagram showing an example of radio communication apparatus.
Figure 2:
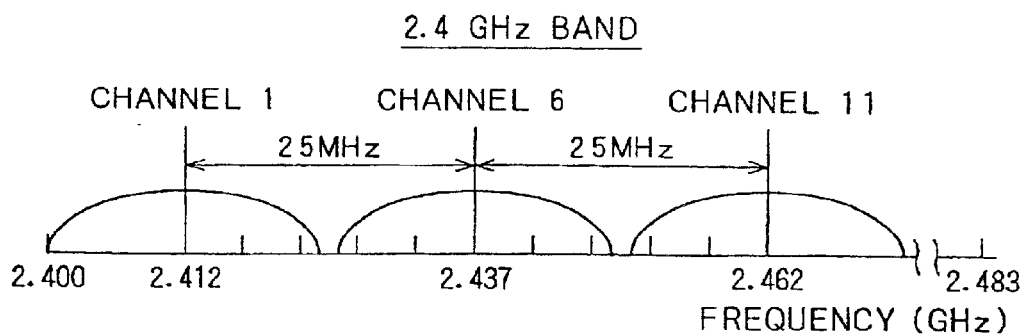
FIG. 2 is a diagrammatic view illustrating the channel configuration of the 2.4 GHz band.
Figure 3:
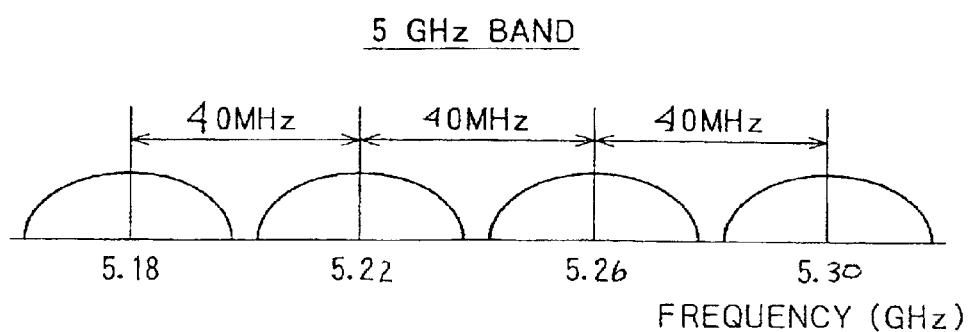
FIG. 3 is a similar view illustrating the channel configuration of the 5 GHz band.

Media access controller 71 is coupled to bus 22 by an interface (I/F) circuit 26 to receive suitable control signals such as a transmit/receive control signal, a frequency band selection control signal and a modulation format control signal. These control signals are used to determine, inter alia, whether radio communication section 70 operates in a transmit or receive mode, such that media access controller either assembles data packets for transmission or disassembles data packets that are received. Likewise, the transmit/receive control signal is used by baseband processor 72 to carry out either a modulation or a demodulation operation. The modulation format control signal supplied from I/F circuit 26 is used by baseband processor 72 to select the modulation format determined by this control signal. The band selection control signal controls front end section 73 such that the front end section is tuned to different frequency channels in different frequency bands to assure optimum communication even in the environment of disturbances and possible interference. For example, and in accordance with the preferred embodiment, the front end section may be tuned to a frequency channel in the 2.4 GHz band or to a particular frequency channel in the 5 GHz band. That is, one of the plural frequency channels schematically depicted in FIG. 2, as well as one of the plural frequency channels schematically depicted in FIG. 3, may be selected under the control of the band selection control signal supplied from I/F circuit 26. The manner in which the band selection and modulation format control signals are determined is described below.

Figure 6:
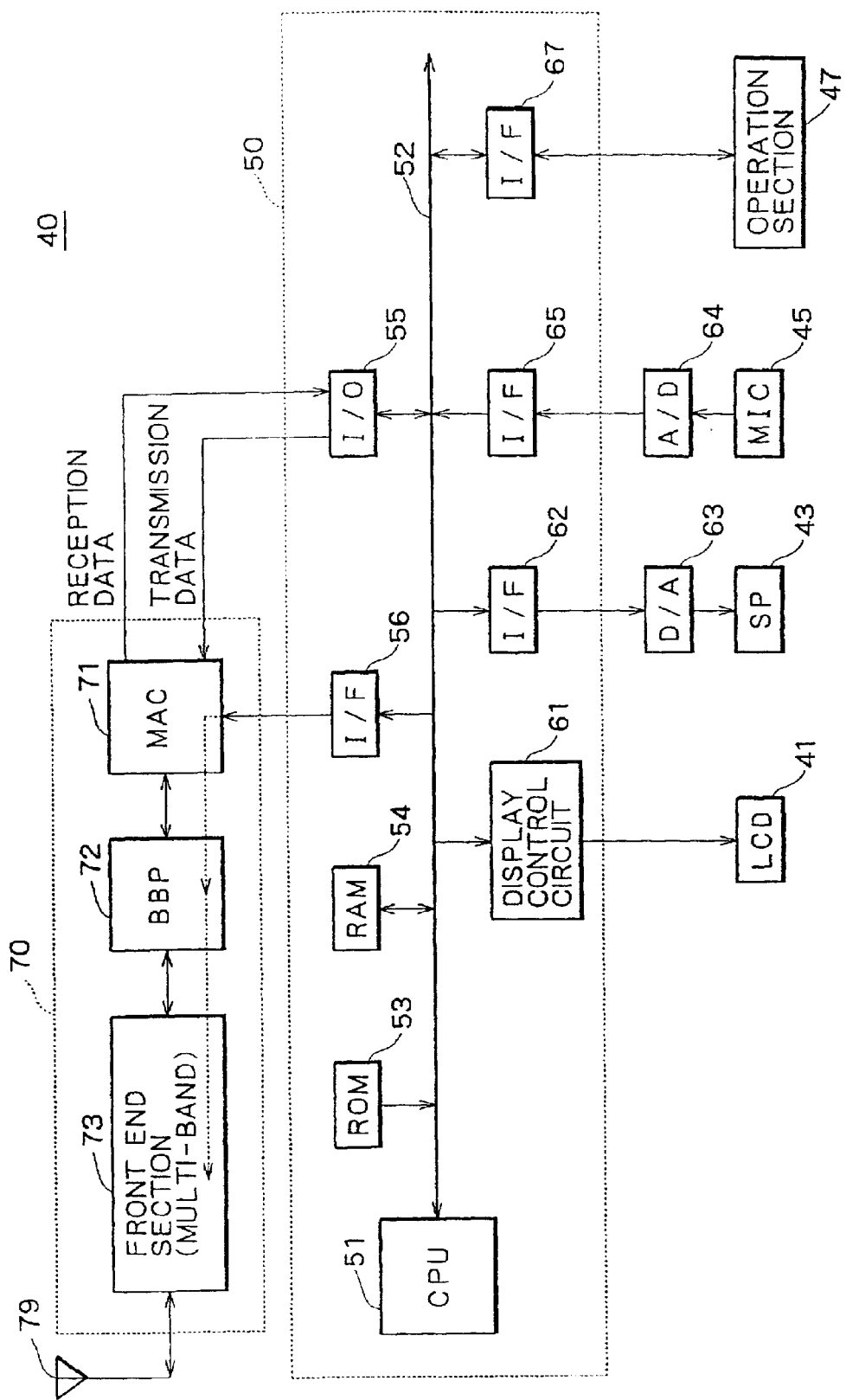
FIG. 6 is a block diagram showing an example of a portable terminal.

FIG. 6 is a schematic block diagram illustration of portable terminal 40 and is seen to comprise radio communication section 70, similar to section 70 discussed above in conjunction with FIG. 5, as well as a control unit 50, similar to control unit 20. In the interest of brevity, radio communication section 70 of FIG. 6 is not described in further detail.

Control unit 50, like control unit 20, includes a CPU 51 (similar to CPU 21), a ROM 53 (similar to ROM 23), a RAM 54 (similar to RAM 24), an I/F circuit 56 (similar to I/F circuit 26) and an I/O port 55 (similar to I/O port 25). It is seen that the CPU, ROM, RAM, I/F circuit and I/O port in FIG. 6 are coupled to a bus 52 that is similar to afore-described bus 22.

LCD unit 41 is coupled to bus 52 by way of a display control circuit 61 and is adapted to display video information recovered from disassembled data packets that are transmitted to the portable terminal from the base terminal. In similar fashion, speaker 43 is coupled to bus 52 by way of interface circuit 62 which receives audio information recovered from the disassembled data packets and supplies that audio information to a digital/analog (D/A) converter, resulting in the driving of speaker 43 by analog audio signals. Microphone 45 is coupled to bus 52 by way of interface circuit 65 which receives digital audio information that is converted by an analog/digital (A/D) converter 64 from the microphone. Thus, digitized audio information from the microphone may be supplied to media access controller 71 by I/O port 55 for assembly into data packets that are transmitted via high frequency radio communication to the base terminal.

Finally, operation section 47, which may be similar to aforedescribed operation section 17, is coupled to bus 52 by way of an interface circuit 67.

As was the case in FIG. 5, data, including A/V information and command data are transmitted to and from bus 52 by way of radio communication section 70. This data may be supplied to the bus from, for example, microphone 45 and operation section 47; and the data may be received from bus 52 for display by LCD unit 41 and speaker 43.

As was the case when describing FIG. 5, I/F circuit 56 of FIG. 6 supplies to radio communication section 70 band selection, modulation format and transmit/receive control signals. These control signals are analogous to the control signals supplied to the radio communication section by I/F circuit 26 so that the portable terminal may operate at the same frequency in the same band with the same modulation format as the base terminal.

Various embodiments of radio communication section 70, as well as components included in the radio communication section, now will be described in connection with the block diagrams illustrated in FIGS. 7–20. Since the same radio communication section is used in both the base terminal and in the portable terminal, this description is applicable to both terminals.

Figure 7:
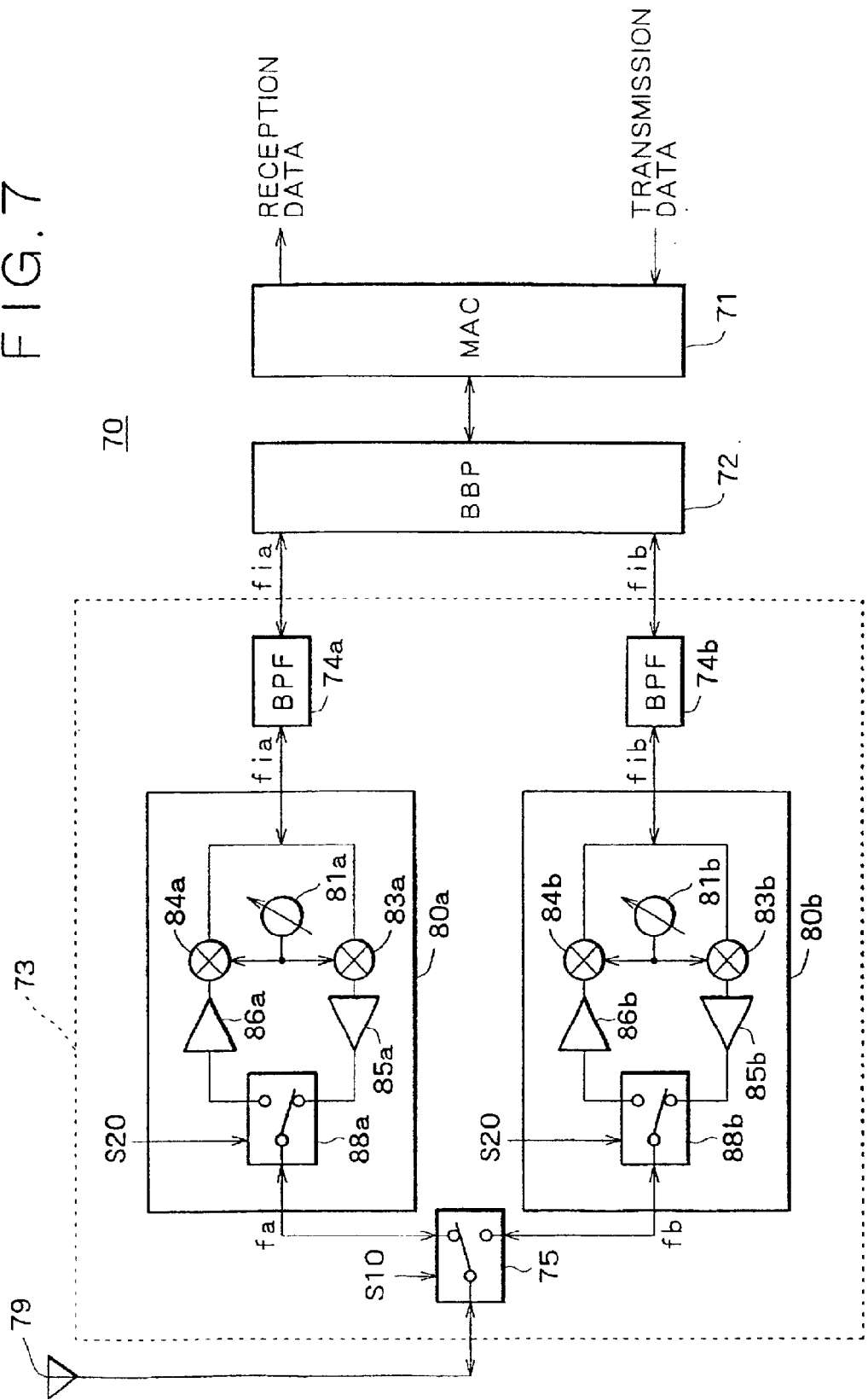
FIG. 7 is a block diagram of radio communication apparatus according to a first embodiment of the present invention.

Turning now to FIG. 7, one embodiment of front end section 73 is illustrated in greater detail. As is depicted, the front end section is coupled to baseband processor 72 which, in turn, is coupled to media access controller 71, as shown in FIGS. 5 and 6. Here, front end section 73 is schematically depicted as including separate front end circuits: a front end circuit 80a, tunable in the 2.4 GHz band, and front end circuit 80b, tunable in the 5 GHz band. A band selector switch 75, controlled by the band selection signal S10, couples either the 2.4 GHz front end circuit 80a or the 5 GHz front end circuit 80b to antenna 79 for the transmission/reception of radio frequency signals in the 2.4 or 5 GHz band. In this embodiment, the modulated data packets are generated as IF signals exhibiting different IF frequencies, depending upon whether the 2.4 GHz band or the 5 GHz band is selected for communication. For example, baseband processor 72 generates an IF signal of frequency fia that is supplied via band pass filter 74a to front end circuit 80a and, similarly, the baseband processor generates the IF signal of IF frequency fib that is supplied to front end circuit 80b by band pass filter 74b. As an example, fia>fib. It will be appreciated that when the respective front end circuits operate to receive and down-convert radio frequency signals, front end circuit 80a generates the IF signal of IF frequency fia and front end circuit 80b generates the IF signal of IF frequency fib.

Front end circuit 80a includes a voltage controlled oscillator 81a whose frequency is controlled by a suitable control voltage to generate a particular frequency in the 2.4 GHz band. This controlled frequency is one of the frequency channels schematically depicted in FIG. 2. A mixer 83a is coupled to oscillator 81a and to band pass filter 74a to up-convert the IF signal from the band pass filter to the frequency channel selected by the oscillator. The up-converted signal is supplied by a power amplifier 85a, a transmit/receive selector switch 88a and band selector switch 75 to antenna 79 for transmission at the high frequency channel fa to which the voltage controlled oscillator is tuned.

Front end circuit 80a also includes a low noise amplifier 86a that receives high frequency radio signals transmitted from a remote location to antenna 79 and supplies those received signals to a mixer 84a for down-conversion to an IF signal of IF frequency fia. The frequency to which voltage controlled oscillator 81a is tuned also is supplied to mixer 84a to effect this down-conversion.

Front end circuit 80b is of similar construction as front end circuit 80a and is used to up-convert the IF signal of IF frequency fib supplied from baseband processor 72 to a frequency channel in the 5 GHz band to which voltage controlled oscillator 81b is tuned. This up-converted signal is supplied from mixer 83b and power amplifier 85b via transmit/receive selector switch 88b and band selector switch 75 to antenna 79 as the high frequency channel fb. Likewise, received high frequency radio communication is supplied from antenna 79 to mixer 84b via switches 75 and 88b as well as low noise amplifier 86b for down-conversion to the IF frequency fib.

Although not shown in FIG. 7, it will be appreciated that various filter circuits may be provided in the respective front end circuits to minimize or prevent spurious emissions of interfering frequencies. Also, although each mixer is schematically depicted as a single circuit, it will be appreciated by those of ordinary skill in the art that each mixer may be constructed as a multi-stage mixer for up-conversion from IF frequencies to higher frequencies and for down-conversion of higher frequencies to IF frequencies.

In operation, the user of the radio communication apparatus initially selects the frequency band, the frequency channel in that band and the modulation format that provide the best communication. For example, base terminal 10 and/or portable terminal 40 may include suitable signal measurement and display devices to indicate to the user the strength of the signal being received. The user may tune the voltage controlled oscillators to the different frequency channels in the different frequency bands while observing the signal strength at each selection. The frequency exhibiting maximum signal strength then may be selected as the frequency channel fa or fb. In one embodiment, the CCK format is used when the selected frequency channel is in the 2.4 GHz band and the OFDM format is used when the selected frequency channel is in the 5 GHz band. Alternatively, regardless of the particular frequency band that is selected, the user may select either the CCK format or the OFDM format, depending upon which format provides the higher signal strength. Consequently, if there are external disturbances to the radio communication link, or if there is interference due to, for example, microwave radiation leakage, the user nevertheless may select a particular frequency channel in a particular frequency band having a particular modulation format that results in optimum communication. Moreover, even after a desired frequency channel is selected, if communication over that channel exhibits interference or disturbances, the user may operate band selector switch 75 to select a different frequency band so as to minimize such disturbances or interference; and the user also, or alternatively, may tune the voltage controlled oscillator to a different frequency channel in order to improve communication. The selection of the desired frequency band, frequency channel and modulation format may be effected by operation section 17 or operation section 47, shown in FIG. 5 and FIG. 6, respectively.

Alternatively, the selection of the desired frequency channel, frequency band and modulation format may be controlled automatically. For example, prior to the communication of data between the base and portable terminals, the tuning of the voltage controlled oscillators may be stepped from channel to channel, and then from band to band (e.g. the band selector switch may be changed over from, for example, the 2.4 GHz band to the 5 GHz band), while the signal strength of the received radio frequencies is measured. CPU 21, or CPU 51, may store temporarily the signal strength of each frequency to which the voltage controlled oscillators are tuned, and the channel frequency whose signal strength is the greatest is selected. Alternatively, rather than measure the received signal strength, the bit error rate of received signals may be determined, and the channel frequency resulting in the smallest bit error rate is selected. Here too, if external disturbances or interference to the communication link, such as microwave radiation leakage, results in a reduction in signal strength or an increase in bit error rate, another frequency channel which supports the higher frequency radio communication with better signal strength and/or better bit error rate is selected.

It will be appreciated that, by using the present invention, such as the embodiment shown in FIG. 7, the number of higher frequency channels that may be assigned for use in a given area is markedly increased. In particular, and using the channel frequency examples shown in FIGS. 2 and 3, seven possible channels now may be assigned, whereas heretofore only three channels (in the 2.4 GHz band) or only four channels (in the 5 GHz band) were available for assignment.

Figure 8:
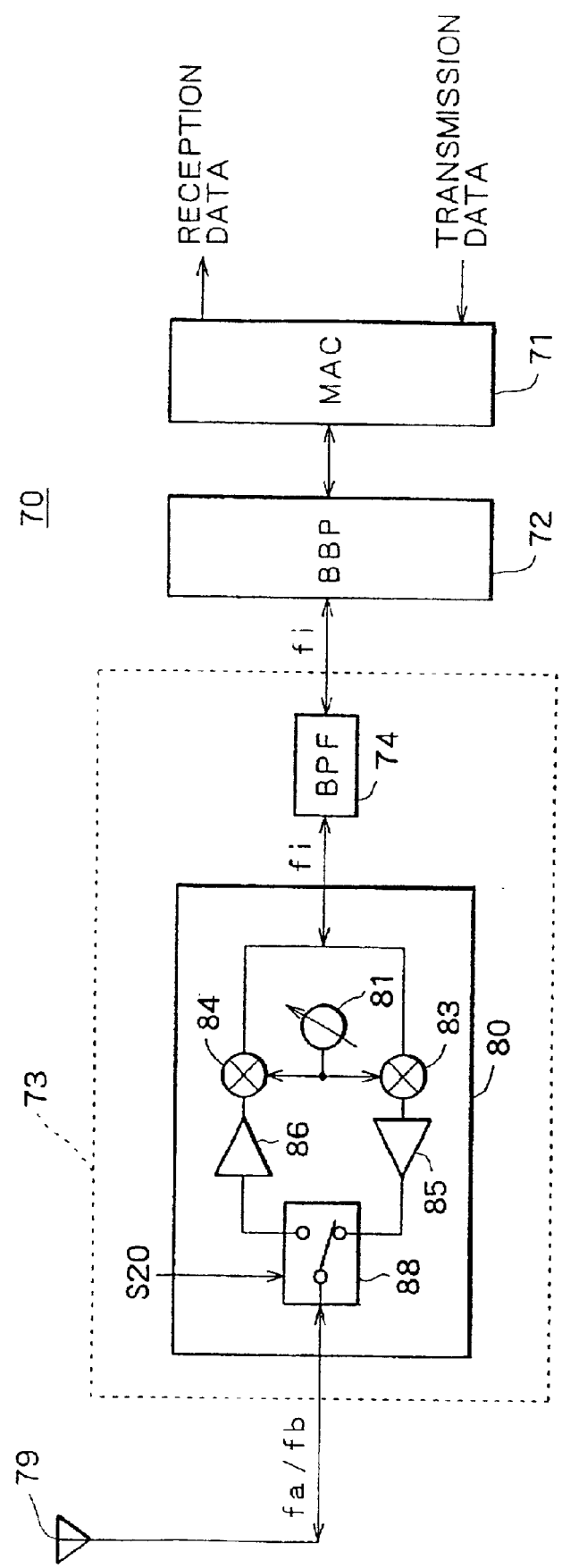
FIG. 8 is a block diagram of radio communication apparatus according to another embodiment of the present invention.

Another embodiment of this invention is depicted schematically in FIG. 8. Here, a single front end circuit 80, tunable in both the 2.4 GHz band and the 5 GHz band, is used, whereas in the embodiment shown in FIG. 7, two separate front end circuits are used. Voltage controlled oscillator 81 thus is tunable to different frequency channels in both the 2.4 GHz band and the 5 GHz band. In this embodiment, baseband processor 72 generates an IF signal whose IF frequency fi is the same for up conversion in both the 2.4 GHz band and in the 5 GHz band. Thus, a common band pass filter 74 is used for both bands.

In the embodiment shown in FIG. 8, if it is difficult or expensive or construct a voltage controlled oscillator that is tunable to different frequency channels in both the 2.4 GHz band and the 5 GHz band, a frequency divider may be used to divide the frequency of the voltage controlled oscillator (which may be approximately 5 GHz) by, for example, a factor of 2 so that the same voltage controlled oscillator nevertheless can be used to generate frequency channels in both bands.

Although not shown in FIG. 8, it will be appreciated that the tuning of the voltage controlled oscillator 81 to a frequency channel in the 2.4 GHz band or in the 5 GHz band is controlled, at least in part, by band selection control signal S10.

Figure 9:
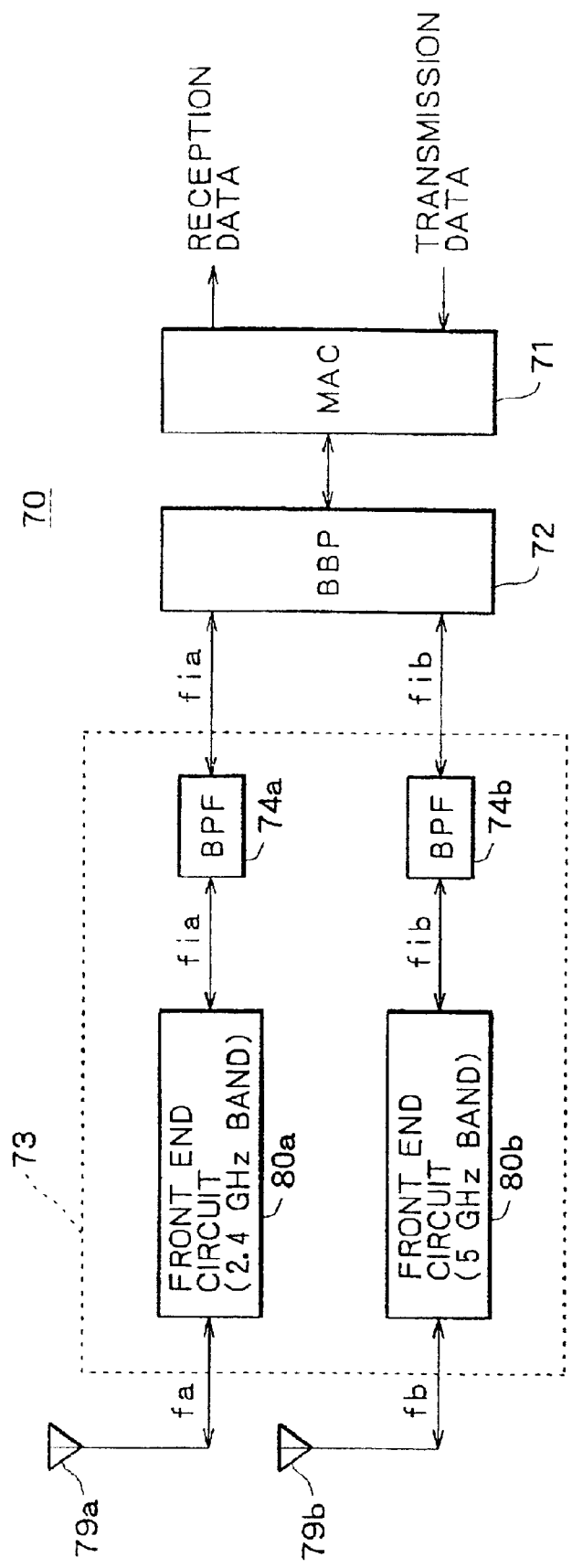
FIG. 9 is a block diagram of radio communication apparatus according to a further embodiment of the present invention.

FIG. 9 is a block diagram of yet another embodiment of the present invention. It will be seen that FIG. 9 is similar to FIG. 7, except that separate antennas are provided for the different frequency bands. Whereas the embodiment shown in FIG. 7 uses a common antenna 79 in both the 2.4 GHz band and the 5 GHz band, the embodiment shown in FIG. 9 uses separate antennas 79a and 79b, respectively.

Figure 10:
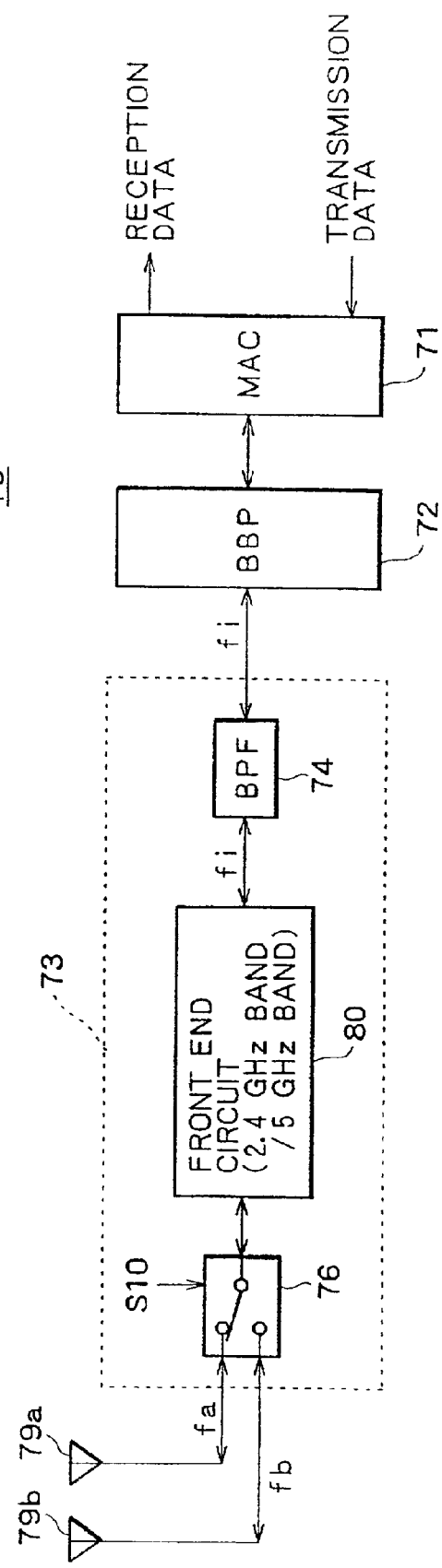
FIG. 10 is a block diagram of radio communication apparatus according to an additional embodiment of the present invention.

FIG. 10 illustrates a further embodiment of the present invention, which is seen to be quite similar to the embodiment shown in FIG. 8. The embodiment of FIG. 9 differs from that of FIG. 8 in that separate antennas 79a and 79b are provided for the difference frequency bands. Thus, as shown in FIG. 10, the output of front end circuit 80, which may be a frequency channel in either the 2.4 GHz band or in the 5 GHz band, is supplied to one or the other of antennas 79a and 79b by way of a selector switch 76 that is controlled by band selection control signal S10. For example, if communication is to proceed in the 2.4 GHz band, switch 76 couples antenna 79a to front end circuit 80. Similarly, if communication is to proceed in the 5 GHz band, switch 76 couples antenna 79b to the front end circuit.

Figure 11:
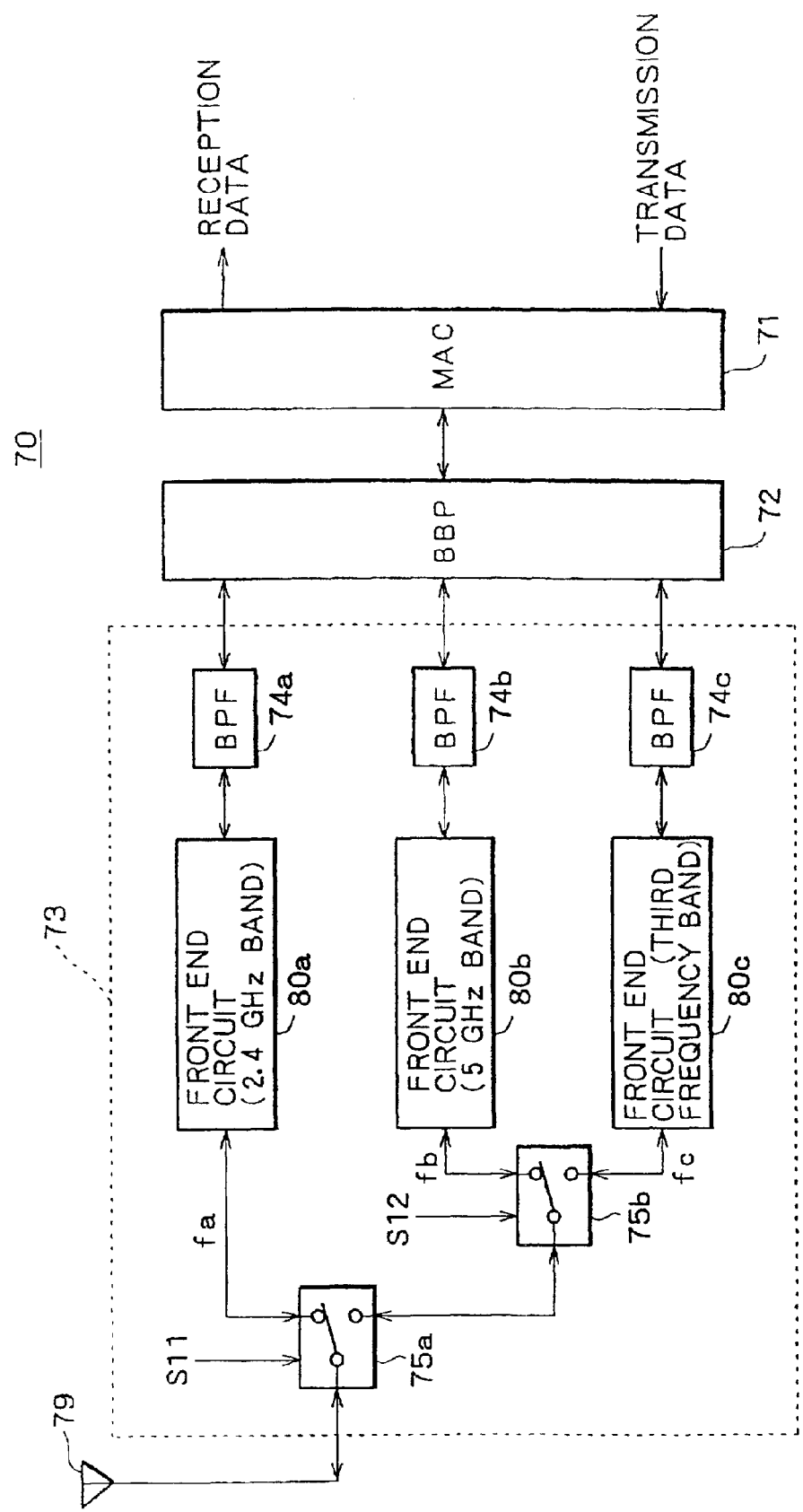
FIG. 11 is a block diagram of radio communication apparatus according to yet another embodiment of the present invention.

FIG. 11 is a block diagram that illustrates a further embodiment of the present invention wherein a third frequency band, other than the 2.4 GHz band and the 5 GHz band, may be selected for use. As an example, this third frequency band may be of a frequency higher than 5 Ghz. Here, front end section 73 may be similar to that shown in FIG. 7 but is provided with a third front end circuit 80c coupled to baseband processor 72 by a band pass filter 74c. Band pass filter 74c is adapted to pass an IF frequency that differs from aforedescribed IF frequencies fia and fib.

Front end circuit 80c may be similar to front end circuits 80a and 80b to generate and receive high frequency channels fc in this third band. Whereas a single band selector switch 75 is shown in FIG. 7, this selector switch is illustrated as, for example, two separate switches 75a and 75b controlled by band selection control signals S11 and S13. Switch 75a, under the control of band selection control signal S11, selectively couples either front end circuit 80a to antenna 79 or permits front end circuit 80b or front end circuit 80c to be coupled to the antenna. Switch 75b, under the control of band selection control signal S12, determines which of the front end circuits 80b and 80c is connected to the antenna.

As an alternative, rather than providing separate switches 75a and 75b, a single 3-way selector switch may be used to selectively connect antenna 79 either to front end circuit 80a or to front end circuit 80b or to front end circuit 80c, depending upon the state of the band selection control signal supplied thereto.

Figure 12:
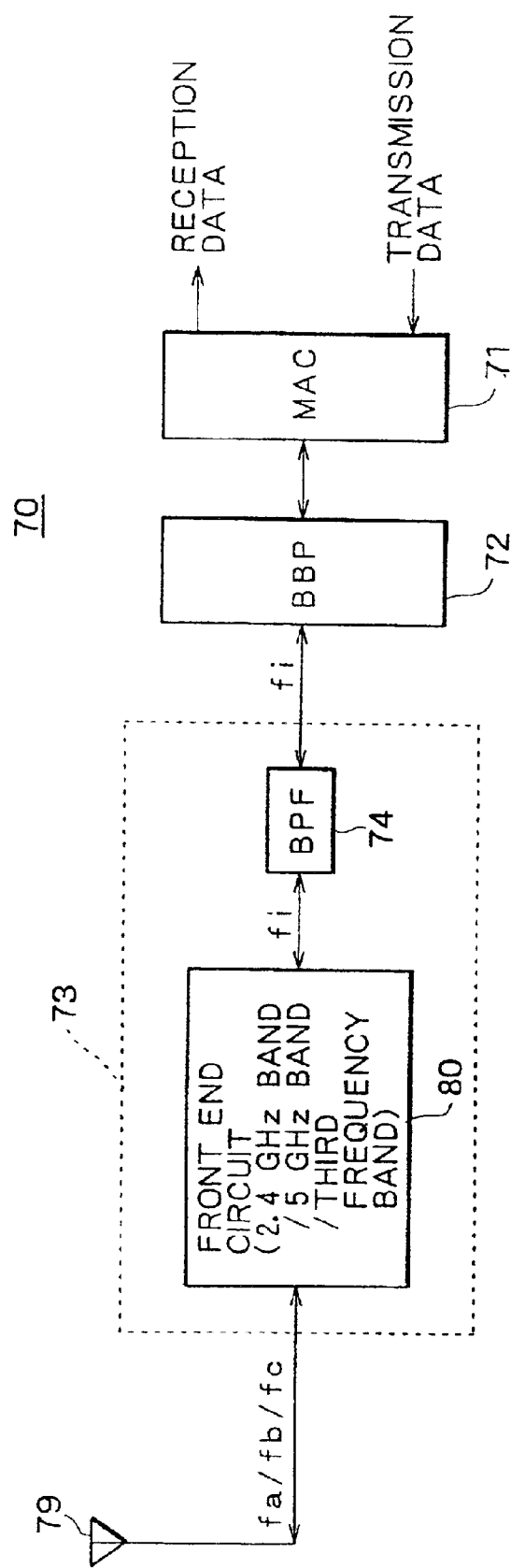
FIG. 12 is a block diagram of radio communication apparatus according to a still further embodiment of the present invention.

FIG. 12 depicts an alternative embodiment to the example shown in FIG. 11. Here, a single front end circuit 80 is provided, this front end circuit being tunable to different frequency channels in each of the three frequency bands. An advantage of the embodiment shown in FIG. 12 is that a single, common IF frequency fi may be used for up conversion (or down-conversion) to each of the three bands. Band pass filter 74 likewise may be of simplified construction when using a common IF frequency. It will be appreciated that the embodiment shown in FIG. 12 is quite similar to that shown in FIG. 8, except that the front end circuit 80 is adapted to be tuned to a desired frequency channel in each of the three radio communication frequency bands.

Figure 13:
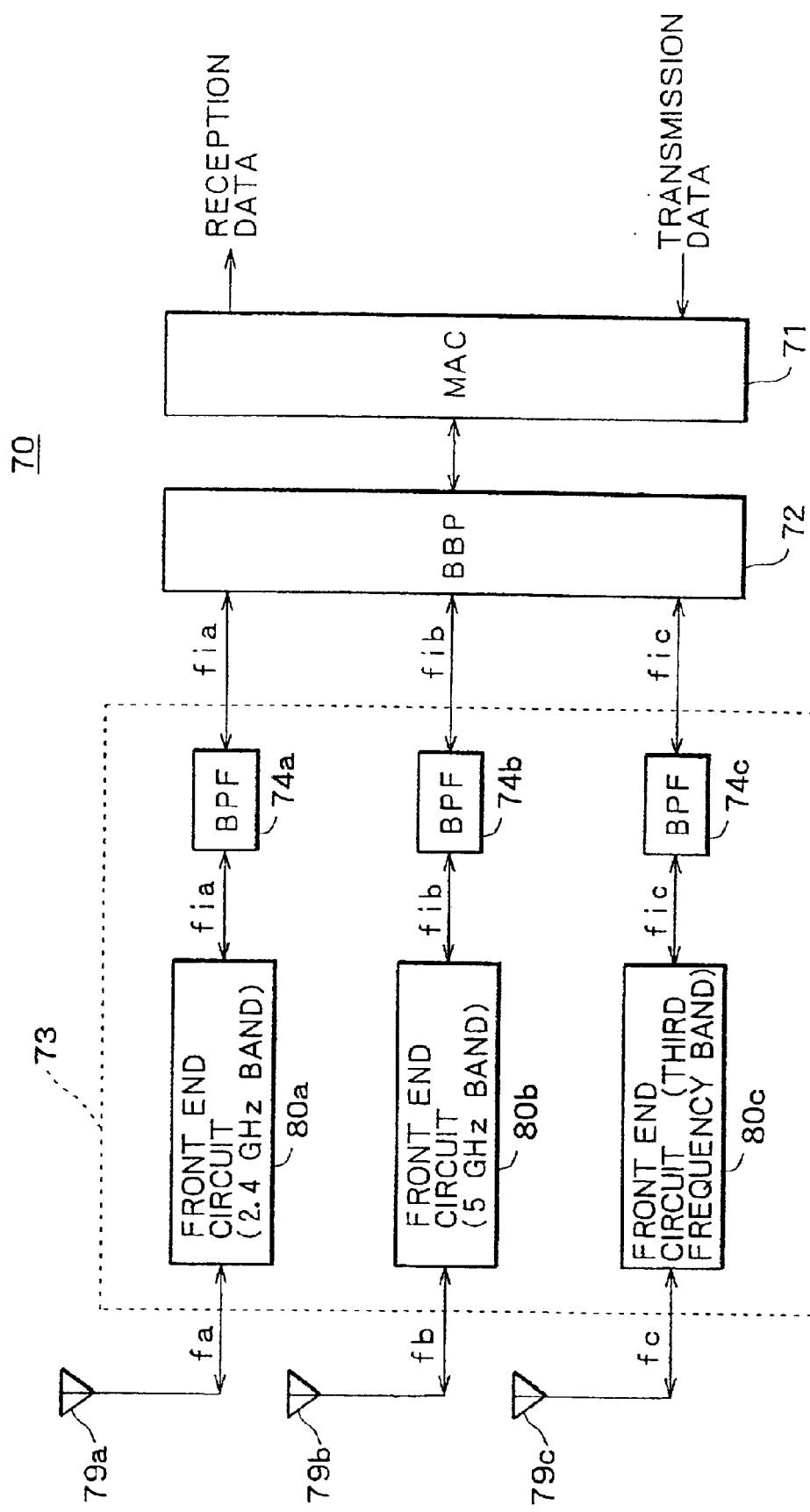
FIG. 13 is a block diagram of radio communication apparatus according to another embodiment of the present invention.

Another alternative to the 3-band front end section 73 is shown in FIG. 13. FIG. 13 differs from the embodiment shown in FIG. 11 in that three separate antennas 79a, 79b and 79c are used for communication in the 2.4 GHz band, the 5 GHz band and the third band, respectively. In this regard, the embodiment shown in FIG. 13 is quite similar to that shown in FIG. 9, except that the front end section 73 in FIG. 9 now is provided with yet a third front end circuit 80c connected to antenna 79c.

Figure 14:
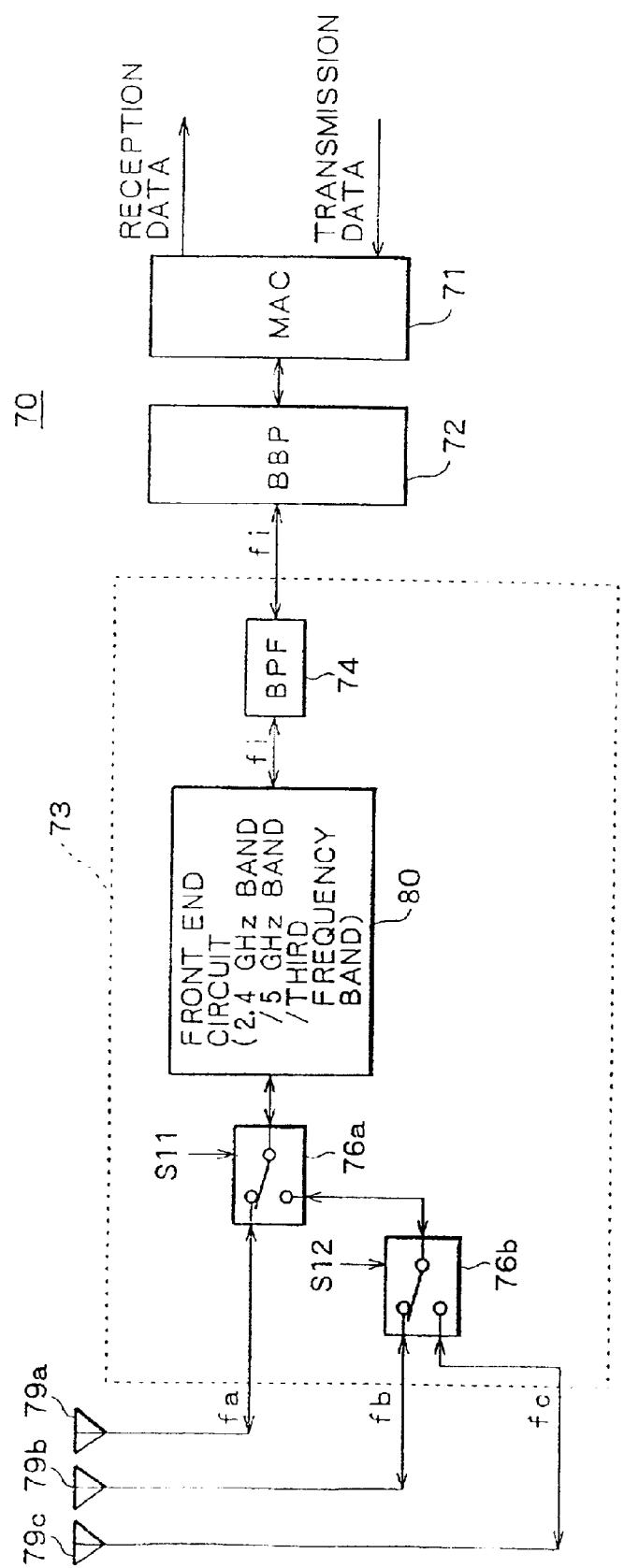
FIG. 14 is a block diagram of radio communication apparatus according to a further embodiment of the present invention.

A still further alternative to the 3-band embodiment is shown in FIG. 14. This embodiment is quite similar to the 2-band embodiment shown in FIG. 10, except that a third antenna 79c is provided for the third frequency band. To implement this embodiment, switch 76 of FIG. 10 may be constructed as two separate switches 76a and 76b, as shown in FIG. 14. Alternatively, switch 76 of FIG. 10 may be constructed as a 3-way switch.

Figure 15:
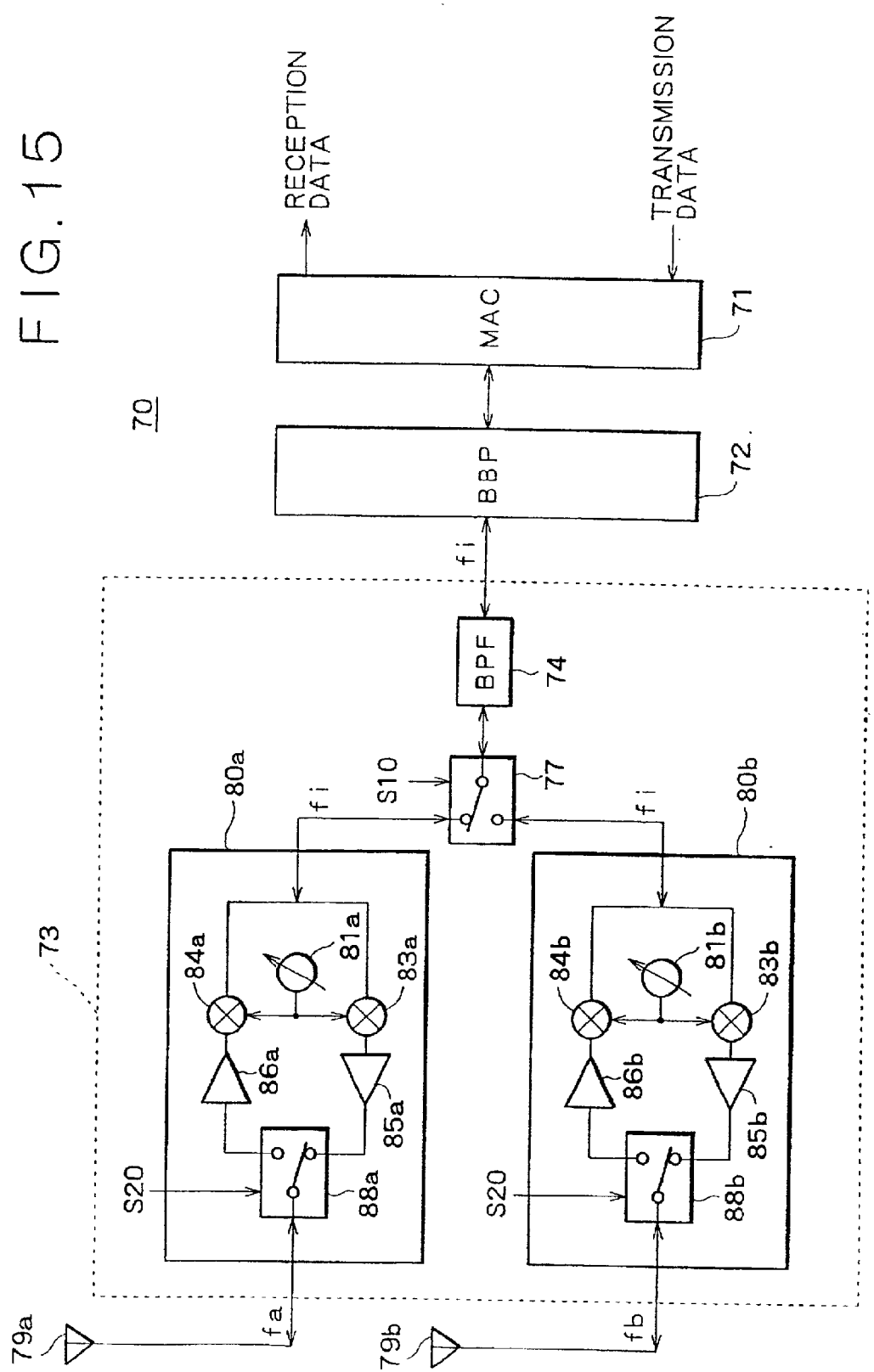
FIG. 15 is a block diagram of radio communication apparatus according to another embodiment of the present invention.

FIG. 15 illustrates a modification to the embodiment shown in FIG. 9. In the FIG. 9 embodiment, different IF frequencies fia and fib are used in cooperation with the 2.4 GHz band and the 5 GHz band, respectively. That is, baseband processor 72 modulates the data onto the IF frequency fia that is up-converted by the 2.4 GHz front end circuit 80a, whereas the data packets are modulated onto the IF frequency fib for up-conversion by the 5 GHz front end circuit 80b. In FIG. 15, a common IF frequency fi is generated by the baseband processor 72, and this common IF frequency is supplied by a band selector switch 77 to front end circuit 80a or to front end circuit 80b under the control of band selection control signal S10.

Figure 16:
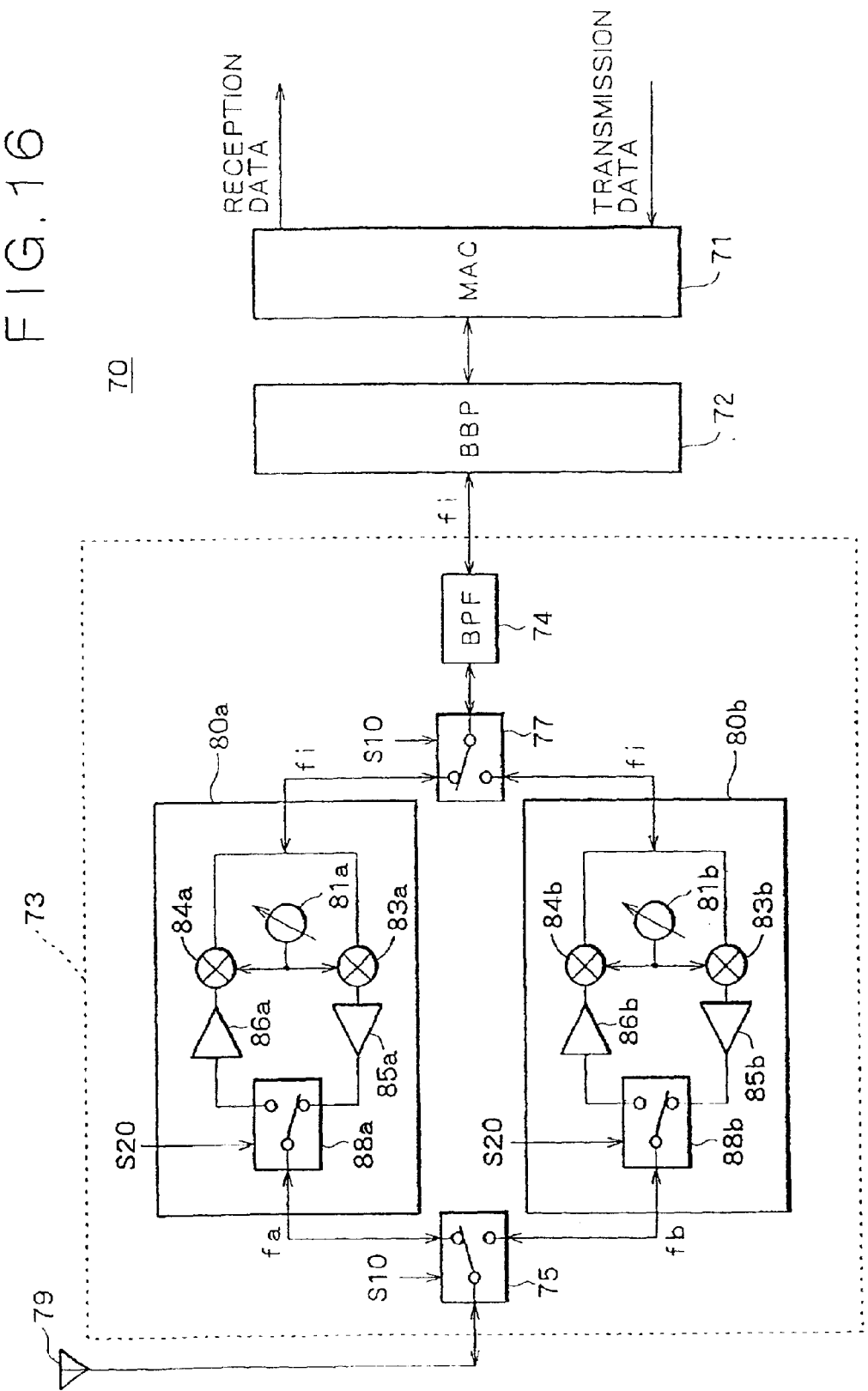
FIG. 16 is a block diagram of radio communication apparatus according to a still further embodiment of the present invention.

Similarly, FIG. 16 is an alternative embodiment to that shown in FIG. 7, using a common IF frequency fi produced by the baseband processor 72. In FIG. 16, this common IF frequency is supplied by band pass filter 74 to front end circuit 80a or to front end circuit 80b by way of a band selector switch 77. Thus, depending upon which frequency band is selected for communication, switches 75 and 77 establish the communication path between antenna 79 and band pass processor 72 through either front end circuit 80a or front end circuit 80b.

Figure 17:
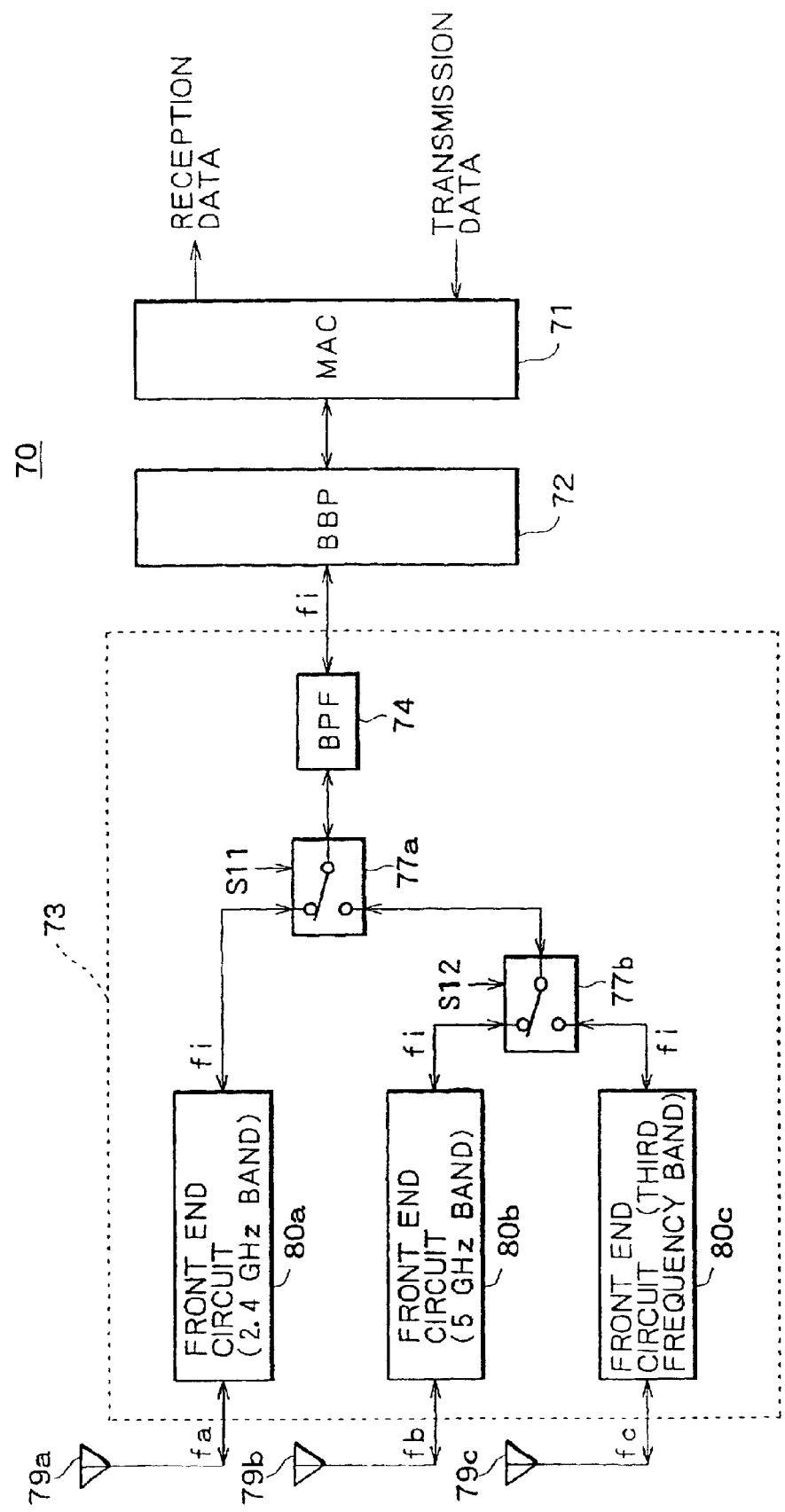
FIG. 17 is a block diagram of radio communication apparatus according to yet another embodiment of the present invention.

FIG. 17 illustrates a modification to the embodiment shown in FIG. 13. Whereas separate IF frequencies fia, fib and fic are used in the FIG. 13 embodiment, FIG. 17 uses a common IF frequency fi. This common IF frequency is supplied to/from front end circuits 80a, 80b and 80c by way of band selector switches 77a and 77b under the control of band selection control signals S11 and S12.

Figure 18:
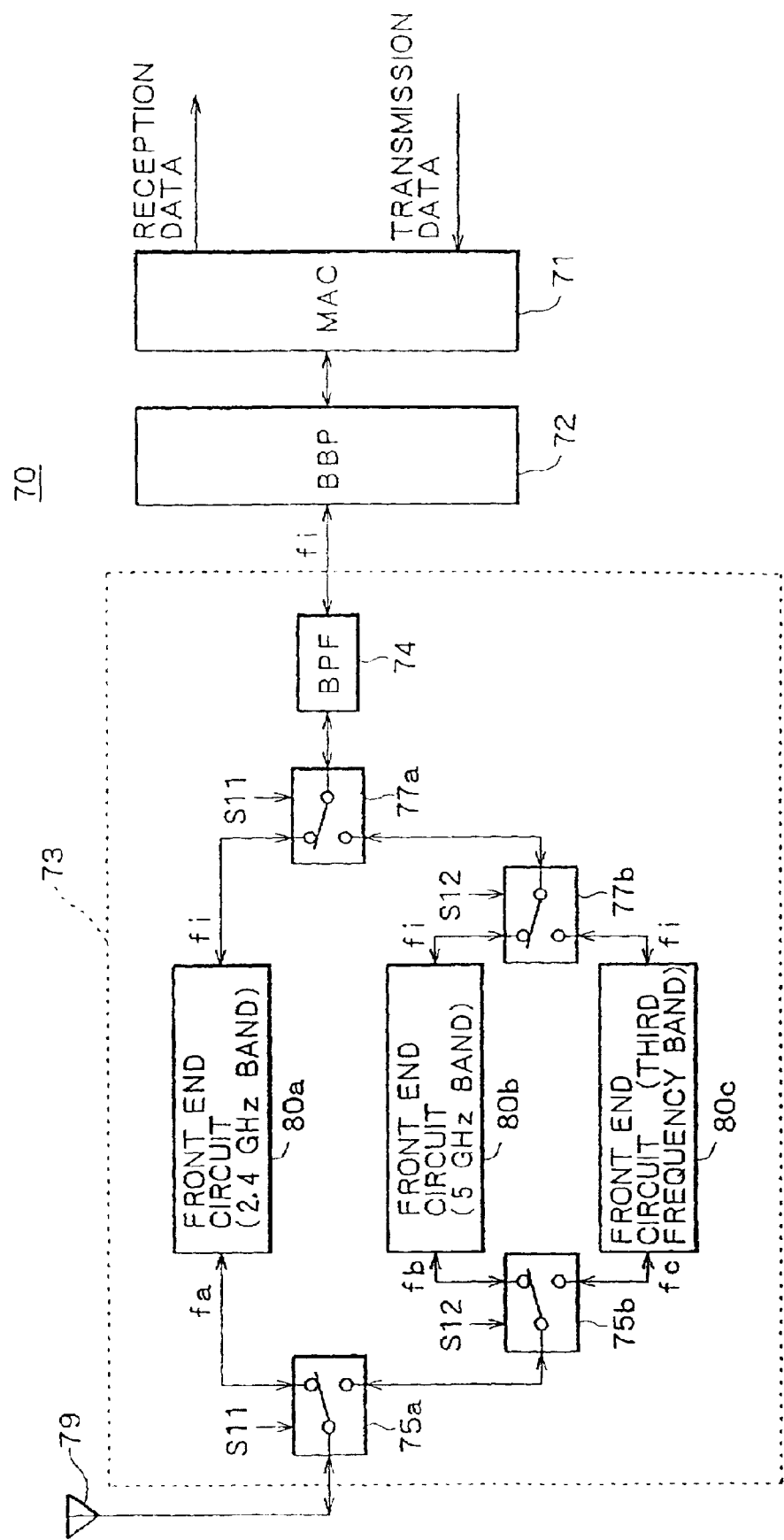
FIG. 18 is a block diagram of radio communication apparatus according to a further embodiment of the present invention.

Similarly, FIG. 18 illustrates a modification of the embodiment shown in FIG. 11, with the FIG. 18 embodiment using a common IF frequency fi, whereas the FIG. 11 embodiment uses separate IF frequencies for front end circuits 80a, 80b and 80c, respectively. Depending upon which frequency band is selected, switches 75a and 75b couple antenna 79 to the appropriate front end circuit; and switches 77a and 77b couple that front end circuit to baseband processor 72 by way of band pass filter 74.

While the embodiments thus far described have suggested the use of two or three different frequency bands, it will be appreciated that the number of frequency bands theoretically is unlimited. A practical constraint on the number of such frequency bands is the cost of constructing the front end circuits and the allocation of available frequencies and bandwidths for use with this invention.

Figure 19:
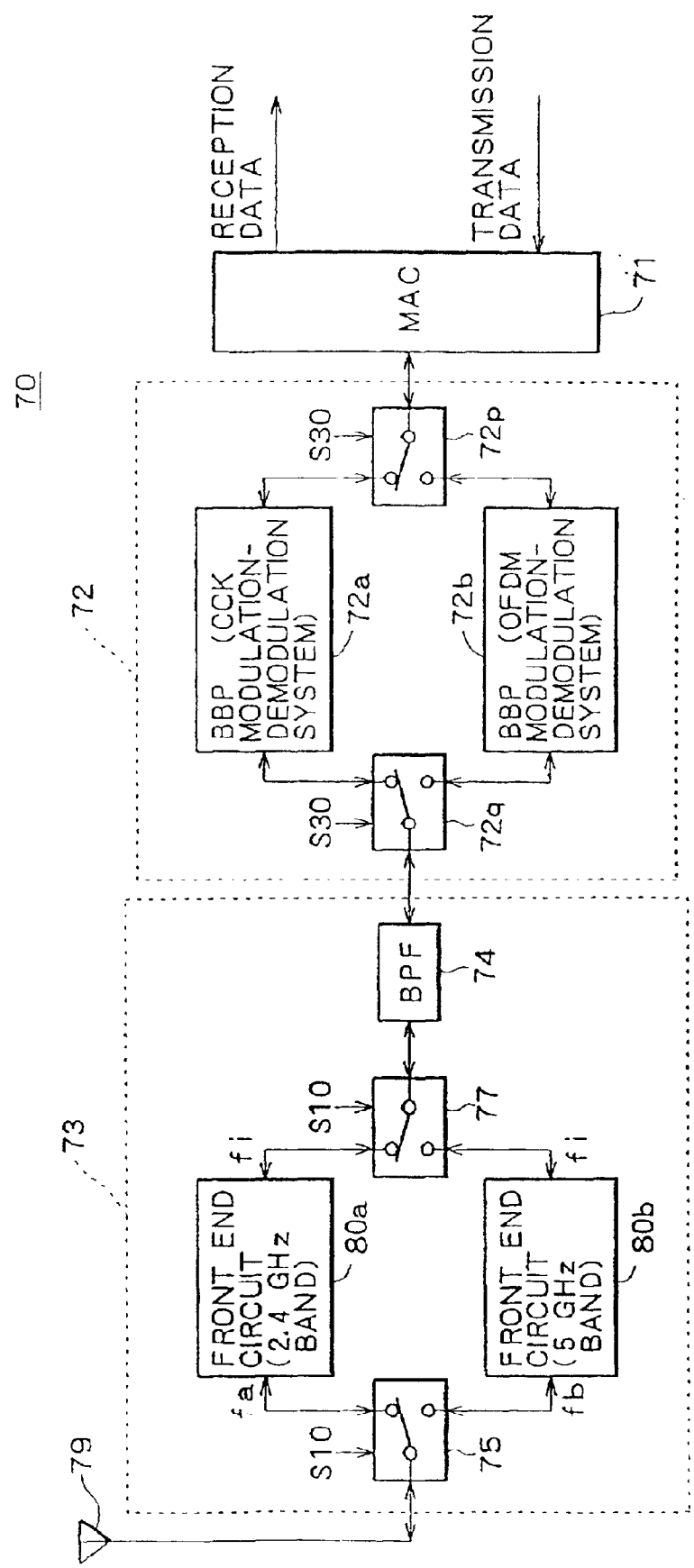
FIG. 19 is a block diagram of radio communication apparatus according to a still further embodiment of the present invention.

FIG. 19 illustrates a still further alternative embodiment of the present invention. FIG. 19 is similar to the embodiment shown in FIG. 7, except that the FIG. 19 embodiment uses a common IF frequency that is supplied to and generated by front end circuits 80a and 80b. In addition, baseband processor 72 is illustrated in FIG. 19 as including separate baseband processors 72a and 72b adapted to operate in accordance with the CCK and OFDM formats, respectively. Switches 72p and 72q, under the control of modulation format control signal S30 couple front end section 73 to media access control section 71 by way of either CCK baseband processor 72a or OFDM baseband processor 72b. Typically, if band selection control signal S10 selects the 2.4 GHz band for communication, modulation format control signal S30 selects the CCK baseband processor. Alternatively, and also typically, if the band selection control signal selects the 5 GHz band for communication, the modulation format signal selects the OFDM baseband processor. It will be appreciated that the selection of the frequency band and the selection of the modulation format are the same in both the base terminal and the portable terminal. One or the other of these terminals may be thought of as the master terminal which sends the appropriate master selection signal to the slave terminal.

Figure 20:
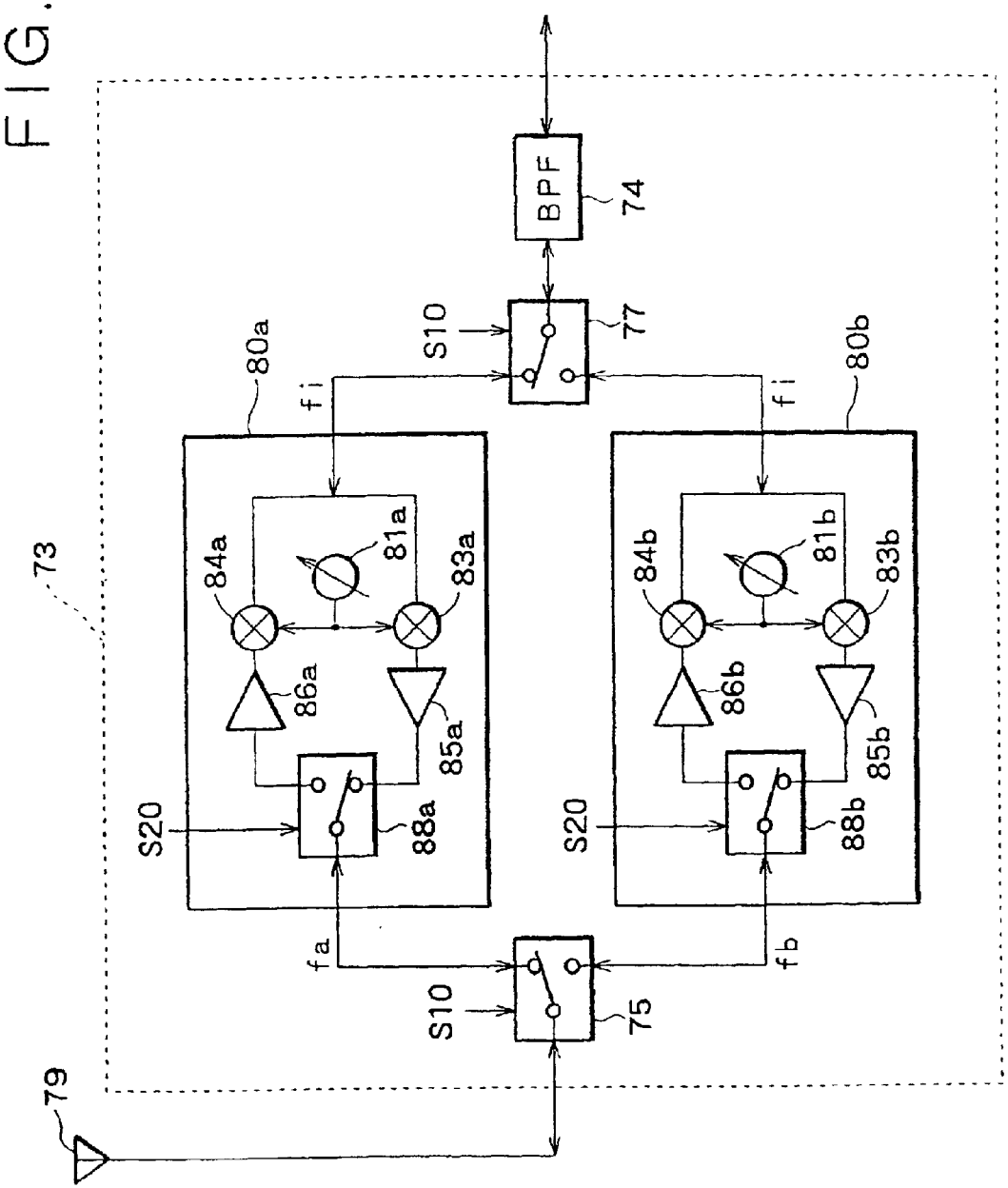
FIG. 20 is a block diagram showing a detailed configuration of the front end section shown in FIG. 19.
Figure 1:
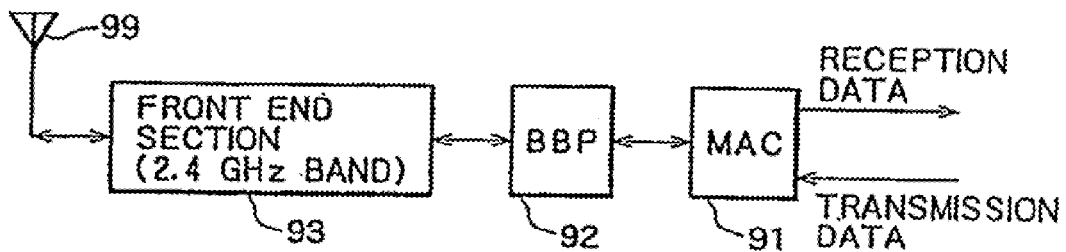
Figure 2:
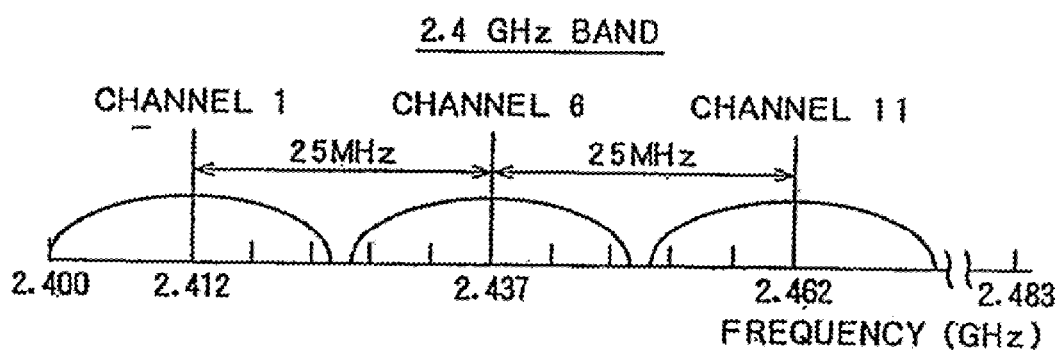
Figure 3:
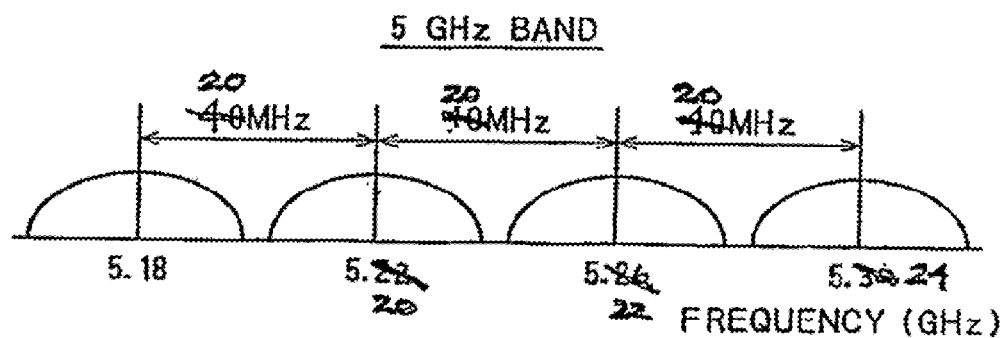

FIG. 20 illustrates, in greater detail, front end section 73 of FIG. 19. It will be appreciated that front end section 73 of FIG. 20 is similar to the front end section shown in FIG. 7, except that FIG. 20 uses a common IF signal of IF frequency fi. Switch 77, under the control of band selection control signal S10, couples the IF signal from band pass filter 74 to front end circuit 80a or front end circuit 80b, depending upon which of the frequency bands is selected. Similarly, when high frequency radio signals are received, switch 77 couples the IF signal from front end circuit 80a or from front end circuit 80b to the band pass filter.

FIGS. 21A–21C illustrate typical arrangements of front end sections and baseband processors using different frequency bands and different modulation formats. For example, radio communication section 90A shown in FIG. 21A illustrates the use of the CCK modulation format when communicating in the 2.4 GHz band.

Similarly, front end section 90B shown in FIG. 21B illustrates the use of the OFDM format when transmitting in the 5 GHz band. Front end section 70D shown in FIG. 21C illustrates the use of baseband processors, operable in the CCK and OFDM formats, respectively, that may be individually selected, depending upon which frequency band is selected. It is seen that radio communication section 70D thus may be of the form shown in FIG. 19. Alternatively, a baseband processor capable of dual format operation may be used as the baseband processor of radio communication section 70D.

Referring now to FIG. 22, there is illustrated a flow chart depicting the operation of, for example, CPU 21 or CPU 51 in response to operation section 17 or operation section 47 to select the frequency band and/or modulation format to effect optimal communication with minimal interference and disturbance. The routine illustrated by the flow chart of FIG. 22 thus selects a frequency channel in a frequency band to transmit and receive data between base terminal 10 and portable terminal 40 as a function of disturbance that may be present on an initially selected frequency channel. Similarly, this routine operates to change over the modulation format either to be compatible with the selected frequency band or to provide improved transmission and reception of data. Let it be assumed that either the CCK format or the OFDM format may be used to modulate/demodulate data, regardless of the frequency band that is selected for radio frequency communication.

In the routine depicted in FIG. 22, instruction S1 first changes over the front end section in the radio communication section of both the base terminal and the portable terminal to the 2.4 GHz band. For example, in the embodiment shown in FIG. 7, front end circuit 80a is selected. The routine then advances to inquiry S2 to determine if acceptable reception of radio communication is possible. For example, the signal strength of the received signal or the error data rate of that signal is measured. If inquiry S2 is answered in the affirmative, the routine advances to instruction S3 which changes over the baseband processor in both the base and portable terminals to operate in the CCK format. Then, the routine advances to inquiry S4 to determine if acceptable demodulation is present. For example, the data that now is transmitted on a frequency channel in the 2.4 GHz band, modulated in the CCK format is demodulated and the error rate of the demodulated data is sensed. If this error rate is acceptable, inquiry S4 is answered in the affirmative and the routine advances to instruction S5, whereat communication is carried out in the 2.4 GHz band using CCK modulation.

However, if inquiry S2 had been answered in the negative, the routine advances to change the frequency band to 5 GHz and then instruction S7 is carried out to change over the modulation format to OFDM. Then, inquiry S8 is made to determine if data that is modulated in the OFDM format can be satisfactorily demodulated. If this inquiry is answered in the affirmative, the routine advances to instruction S5 and communication is maintained in the 5 GHz band and in accordance with the OFDM format. But, if inquiry S8 is answered in the negative, the routine advances to instruction S9 which changes over the modulation format from OFDM to CCK. Communication now is maintained in the 5 GHz band and in accordance with the CCK format.

If inquiry S4 had been answered in the negative, that is, if communication in the 2.4 GHz band and in accordance with the CCK format did not result in acceptable demodulation (but the signal strength of the frequency channel in the 2.4 GHz band was acceptable), instruction S6 is carried out to change over the modulation format from CCK to OFDM. Thus, communication is maintained in the 2.4 GHz band and in accordance with the OFDM format.

While the present invention has been particularly shown and described with reference to several preferred embodiments, it will be readily appreciated by those of ordinary skill in the art that various changes and modifications may be made without departing from the spirit and scope of the invention. For example, base terminal 10 may include a tuner capable of receiving digital broadcast transmissions, such as digital TV transmissions. The information included in those transmissions are recovered, assembled into data packets, modulated and up-converted by radio communication section 70. In accordance with the present invention, the base terminal communicates with the portable terminal by tuning the front end section in the radio communication section of both terminals to a selected frequency channel in a selected frequency band using a particular modulation format so as to minimize the affects of external interference and disturbances. That is, the particular frequency channel and/or modulation format that is selected may be thought of as a function of disturbance that may be present in the environment.

As a result of the present invention, the number of frequency channels that can be assigned in a given area may be increased significantly while minimizing the likelihood that the communication link between base and portable terminals will be interrupted as a result of external influences. Furthermore, the radio communication section of the present invention may be constructed efficiently and inexpensively.

What is claimed is:

1. Apparatus for communicating by radio, comprising:
   (a) a baseband processor for modulating data to be transmitted into an intermediate frequency signal;
   (b) the baseband processor demodulating an intermediate frequency signal derived from a received high frequency signal;
   (c) a front end section for receiving the intermediate frequency signal from said baseband processor and converting the received intermediate frequency signal into a high frequency signal;
   (d) the front end section transmitting the high frequency signal;
   (e) the front end section receiving a high frequency signal from a remote location and converting the received high frequency signal into an intermediate frequency signal;
   (f) the front end section supplying the converted intermediate frequency signal to said baseband processor;
   (g) said front end section being tunable to different frequency channels in each of a plurality of frequency bands for use as a radio frequency channel within a selected one of the frequency bands; and
   (h) a frequency change-over selector for selecting a frequency channel in a frequency band to transmit and receive said data to avoid disturbance that may be present on an initially selected frequency channel.

2. The apparatus of claim 1, wherein said front end section includes a plurality of front end circuits, each front end circuit tunable within a respective one of the frequency bands.

3. The apparatus of claim 1, wherein said front end section includes a front end circuit common to the plurality of frequency bands.

4. The apparatus of claim 1, further comprising a plurality of antennae, each antenna transmitting and receiving high frequency signals within a respective one of the frequency bands.

5. The apparatus of claim 1, further comprising a common antenna for transmitting and receiving high frequency signals within all of the frequency bands.

6. The apparatus of claim 1, wherein the frequency bands include a 2.4 GHz band and a 5 GHz band.

7. Wireless communication equipment, comprising:
   (a) a radio communication section comprising:
      (i) a baseband processor for modulating data to be transmitted into an intermediate frequency signal;
      (ii) the baseband processor demodulating an intermediate frequency signal derived from a received high frequency signal;
      (iii) a front end section for receiving the intermediate frequency signal from said baseband processor and converting the received intermediate frequency signal into a high frequency signal;
      (iv) the front end section transmitting the high frequency signal;
      (v) the front end section receiving a high frequency signal from a remote location and converting the received high frequency signal into an intermediate frequency signal;
      (vi) the front end section supplying the converted intermediate frequency signal to said baseband processor;
      (vii) said front end section being tunable to different frequency channels in each of a plurality of frequency bands for use as a radio frequency a frequency channel within a selected one of the frequency bands; and
   (b) a control section for selecting one of the frequency bands and a frequency channel within the selected frequency band to avoid interference that otherwise would impair communication.

8. Apparatus for communicating by radio, comprising:
   (a) a baseband processor for modulating data to be transmitted into an intermediate frequency signal;
   (b) the baseband processor demodulating an intermediate frequency signal derived from a received high frequency signal;
   (c) a front end section for receiving the intermediate frequency signal from said baseband processor and converting the received intermediate frequency signal into a high frequency signal;
   (d) the front end section transmitting the high frequency signal;
   (e) the front end section receiving a high frequency signal from a remote location and converting the received high frequency signal into an intermediate frequency signal;
   (f) the front end section supplying the converted intermediate frequency signal to said baseband processor;

(g) said front end section being tunable to different frequency channels in each of a plurality of frequency bands for use as a radio frequency channel within a selected one of the frequency bands;

(h) a frequency change-over selector for selecting a frequency channel in a frequency band to transmit and receive said data to avoid disturbance that may be present on an initially selected frequency channel; and (i) the intermediate frequency signal having an intermediate frequency which is common to the plurality of frequency bands.

9. The apparatus of claim 8, wherein said front end section includes a plurality of front end circuits, each front end circuit tunable within a respective one of the frequency bands.

10. The apparatus of claim 8, wherein said front end section includes a front end circuit common to the plurality of frequency bands.

11. The apparatus of claim 8, further comprising a plurality of antennae, each antenna transmitting and receiving high frequency signals within a respective one of the frequency bands.

12. The apparatus of claim 8, further comprising a common antenna for transmitting and receiving high frequency signals within all of the frequency bands.

13. The apparatus of claim 8, wherein the frequency bands include a 2.4 GHz band and a 5 GHz band.

14. Wireless communication equipment, comprising:

(a) a radio communication section comprising:
  (i) a baseband processor for modulating data to be transmitted into an intermediate frequency signal;
  (ii) the baseband processor demodulating an intermediate frequency signal derived from a received high frequency signal;
  (iii) a front end section for receiving the intermediate frequency signal from said baseband processor and converting the received intermediate frequency signal into a high frequency signal;
  (iv) the front end section transmitting the high frequency signal;
  (v) the front end section receiving a high frequency signal from a remote location and converting the received high frequency signal into an intermediate frequency signal;
  (vi) the front end section supplying the converted intermediate frequency signal to said baseband processor;
  (vii) said front end section being tunable to different frequency channels in each of a plurality of frequency bands for use as a radio frequency a frequency channel within a selected one of the frequency bands;
  (viii) the intermediate frequency signal having a frequency which is common to the plurality of frequency bands; and (b) a control section for selecting one of the frequency bands and a frequency channel within the selected frequency band to avoid interference that otherwise would impair communication.

15. Apparatus for communicating by radio, comprising:

(a) a baseband processor operable in accordance with different modulation/demodulation formats for modulating data to be transmitted into an intermediate frequency signal and for demodulating an intermediate frequency signal derived from a received high frequency signal;

(b) a front end section for receiving the intermediate frequency signal from said baseband processor and converting the received intermediate frequency signal into a high frequency signal;

(c) the front end section transmitting the high frequency signal;

(d) the front end section receiving a high frequency signal from a remote location and converting the received high frequency signal into an intermediate frequency signal;

(e) the front end section supplying the converted intermediate frequency signal to said processor;

(f) said front end section being tunable to different frequency channels in each of a plurality of frequency bands, for use as a radio frequency a frequency channel within a selected one of the frequency bands; and (g) a format selector for selecting one of said different modulation/demodulation formats to provide improved signal transmission and reception.

16. The apparatus of claim 15, wherein the frequency bands include a 2.4 GHz band and a 5 GHz band, and the modulation/demodulation formats include complementary code keying (CCK) and orthogonal frequency division multiplexing (OFDM).

17. The apparatus of claim 15, wherein the intermediate frequency signal has an intermediate frequency which is common to the plurality of frequency bands.

18. Wireless communication equipment, comprising:

(a) a radio communication section comprising:
  (i) a baseband processor operable in accordance with different modulation/demodulation formats for modulating data to be transmitted into an intermediate frequency signal and for demodulating an intermediate frequency signal derived from a received high frequency signal;
  (ii) a front end section for receiving the intermediate frequency signal from said baseband processor and converting the received intermediate frequency signal into a high frequency signal;
  (iii) the front end section transmitting the high frequency signal;
  (iv) the front end section receiving a high frequency signal from a remote location and converting the received high frequency signal into an intermediate frequency signal;
  (v) the front end section supplying the converted intermediate frequency signal to said baseband processor;
  (vi) said front end section being tunable to different frequency channels in each of a plurality of frequency bands for use as a radio frequency a frequency channel within a selected one of the frequency bands;

(b) a format selector for selecting one of said different modulation/demodulation formats to provide improved signal transmission and reception; and (c) a frequency selector for selecting a frequency channel in a frequency band to transmit and receive said data, said frequency selector being operable to change frequency bands and frequency channels to avoid disturbance that may be present on an initially selected frequency channel.

19. The equipment of claim 18, wherein the frequency bands include a 2.4 GHz band and a 5 GHz band and the modulation/demodulation formats include complementary code keying (CCK) and orthogonal frequency division multiplexing (OFDM), said format selector selecting CCK when said frequency selector selects the 2.4 GHz band, and said format selector selecting OFDM when said frequency selector selects the 5 GHz band.

* * * * *

UNITED STATES PATENT AND TRADEMARK OFFICE
CERTIFICATE OF CORRECTION

PATENT NO. : 6,992,990 B2 Page 1 of 2
APPLICATION NO. : 09/904281
DATED : January 31, 2006
INVENTOR(S) : Sakyusabe It is certified that error appears in the above-identified patent and that said Letters Patent is hereby corrected as shown below:

Drawing Sheet 1 of 20 is hereby replaced by the Attached Replacement Sheet 1 of 20

Signed and Sealed this

Fourth Day of September, 2007

JON W. DUDAS
*Director of the United States Patent and Trademark Office*